US 9,412,823 B2

United States Patent
Ota et al.

(10) Patent No.: US 9,412,823 B2
(45) Date of Patent: Aug. 9, 2016

(54) SEMICONDUCTOR DEVICE AND METHOD OF MANUFACTURING THE SAME

(71) Applicant: Kabushiki Kaisha Toshiba, Minato-ku (JP)

(72) Inventors: Chiharu Ota, Kanagawa (JP); Tatsuo Shimizu, Tokyo (JP); Johji Nishio, Tokyo (JP); Takashi Shinohe, Kanagawa (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/855,669

(22) Filed: Sep. 16, 2015

(65) Prior Publication Data

US 2016/0005820 A1    Jan. 7, 2016

Related U.S. Application Data

(62) Division of application No. 14/205,964, filed on Mar. 12, 2014, now Pat. No. 9,171,908.

(30) Foreign Application Priority Data

Mar. 22, 2013   (JP) .................................. 2013-059831

(51) Int. Cl.
*H01L 29/66*    (2006.01)
*H01L 29/16*    (2006.01)
(Continued)

(52) U.S. Cl.
CPC ...... *H01L 29/1608* (2013.01); *H01L 21/02378* (2013.01); *H01L 21/02529* (2013.01); *H01L 21/02576* (2013.01); *H01L 21/02579* (2013.01);
(Continued)

(58) Field of Classification Search
None
See application file for complete search history.

(56) References Cited

U.S. PATENT DOCUMENTS

2003/0172869 A1  9/2003  Yoshida et al.
2005/0028115 A1  2/2005  Whitefield et al.
(Continued)

FOREIGN PATENT DOCUMENTS

CN    1367937 A    9/2002
CN    1729577 A    2/2006
(Continued)

OTHER PUBLICATIONS

Office Action mailed Jun. 3, 2016 in Chinese Patent Application No. 201410076396.0 (with English Translation.
Masanori Miyata, et al. "Theoretical Study of Acceptor-Donor Complexes in 4H-SiC," Applied Physics Express 1 (2008), 111401, 4 Pages.

*Primary Examiner* — Daniel Luke
(74) *Attorney, Agent, or Firm* — Oblon, McClelland, Maier & Neustadt, L.L.P

(57) ABSTRACT

A semiconductor device of an embodiment includes, an n-type SiC substrate that has first and second faces, and contains a p-type impurity and an n-type impurity, the p-type impurity being an element A, the n-type impurity being an element D, the element A and the element D being a combination of Al (aluminum), Ga (gallium), or In (indium) and N (nitrogen), and/or a combination of B (boron) and P (phosphorus), the ratio of the concentration of the element A to the concentration of the element D in the combination(s) being higher than 0.40 but lower than 0.95, the concentration of the element D forming the combination(s) being not lower than $1\times10^{18}$ cm$^{-3}$ and not higher than $1\times10^{22}$ cm$^{-3}$, an SiC layer formed on the first face, a first electrode formed on the first face side, and a second electrode formed on the second face.

5 Claims, 12 Drawing Sheets

(51) Int. Cl.
*H01L 29/167* (2006.01)
*H01L 21/02* (2006.01)
*H01L 21/04* (2006.01)
*H01L 29/78* (2006.01)
*H01L 29/872* (2006.01)
*H01L 29/808* (2006.01)
*H01L 29/868* (2006.01)
*H01L 29/739* (2006.01)
*H01L 29/861* (2006.01)
*H01L 29/36* (2006.01)

(52) U.S. Cl.
CPC ............ *H01L 21/046* (2013.01); *H01L 29/167* (2013.01); *H01L 29/36* (2013.01); *H01L 29/6606* (2013.01); *H01L 29/66068* (2013.01); *H01L 29/7395* (2013.01); *H01L 29/7802* (2013.01); *H01L 29/7827* (2013.01); *H01L 29/808* (2013.01); *H01L 29/8083* (2013.01); *H01L 29/861* (2013.01); *H01L 29/868* (2013.01); *H01L 29/872* (2013.01)

(56) References Cited

U.S. PATENT DOCUMENTS

| | | | |
|---|---|---|---|
| 2009/0134405 | A1 | 5/2009 | Ota et al. |
| 2010/0159182 | A1* | 6/2010 | Straubinger .......... C30B 23/002 428/66.7 |
| 2010/0289033 | A1 | 11/2010 | Ohtani et al. |
| 2012/0025153 | A1 | 2/2012 | Hirose et al. |

FOREIGN PATENT DOCUMENTS

| | | |
|---|---|---|
| CN | 101896647 A | 11/2010 |
| JP | 2001-274373 | 10/2001 |
| JP | 2007-320790 A | 12/2007 |
| JP | 2008-4726 | 1/2008 |
| JP | 2009-130266 | 6/2009 |
| JP | 2009-167047 | 7/2009 |
| JP | 2010-53035 | 3/2010 |
| JP | 2011-93771 | 5/2011 |
| JP | 2012-31014 | 2/2012 |

* cited by examiner

US 9,412,823 B2

SEMICONDUCTOR DEVICE AND METHOD OF MANUFACTURING THE SAME

CROSS-REFERENCE TO RELATED APPLICATION

This application is a division of and claims the benefit of priority under 35 C.F.R. §120 from U.S. Ser. No. 14/205,964 filed Mar. 12, 2014, and claims the benefit of priority under 35 U.S.C. §119 from Japanese Patent Application No. 2013-059831 filed Mar. 22, 2013, the entire contents of each of which are incorporated herein by reference.

FIELD

Embodiments described herein relate generally to a semiconductor device and a method of manufacturing the same.

BACKGROUND

SiC (silicon carbide) is expected to be a material for next-generation power semiconductor devices. SiC has excellent physical properties, having a band gap three times wider than that of Si (silicon), a breakdown field strength approximately 10 times higher than that of Si, and a heat conductivity approximately three times higher than that of Si. A power semiconductor device that has low loss and is capable of high-temperature operation can be realized by taking advantage of those properties.

Meanwhile, it is difficult to lower the resistance of SiC, because the solid solubility limits of impurities are low, and levels formed with impurities in the band gap are deep. Therefore, it is difficult to lower the ON resistance of a device that uses SiC.

DETAILED DESCRIPTION

Figure 1:
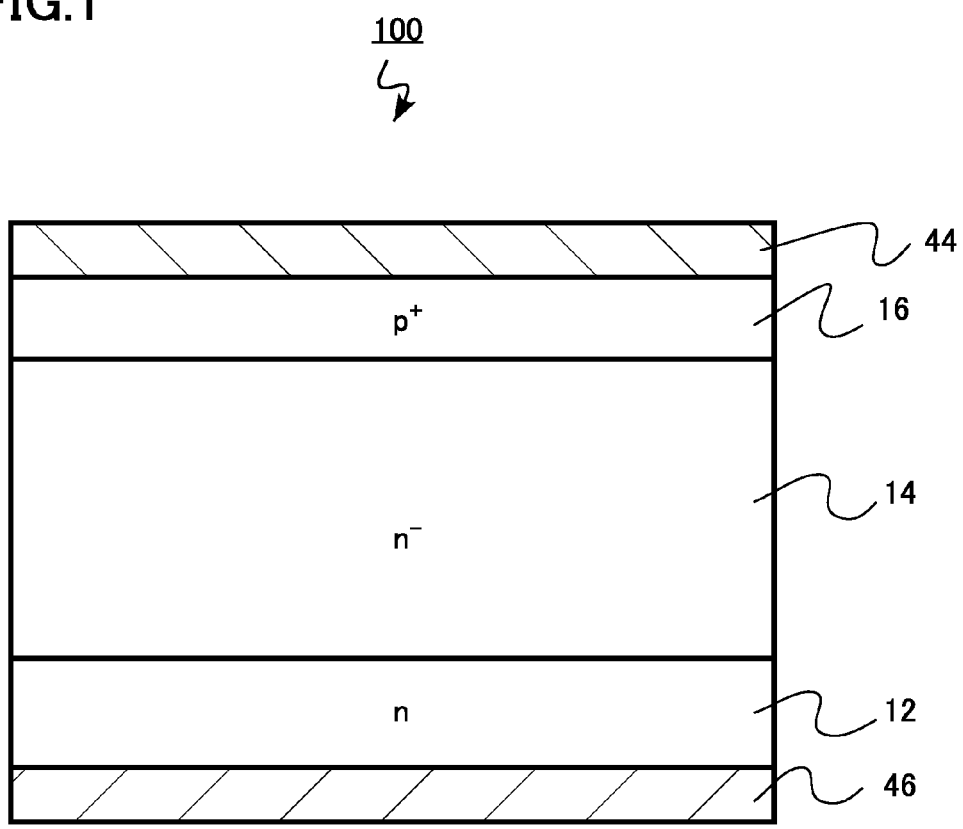
FIG. 1 is a schematic cross-sectional view of a semiconductor device of a first embodiment.

A semiconductor device of an embodiment includes: an n-type SiC substrate that has first face and second face, and contains a p-type impurity and an n-type impurity, the p-type impurity being an element A, the n-type impurity being an element D, the element A and the element D being a combination of Al (aluminum), Ga (gallium), or In (indium) and N (nitrogen), and/or a combination of B (boron) and P (phosphorus), the ratio of the concentration of the element A to the concentration of the element D in the combination (s) being higher than 0.40 but lower than 0.95, the concentration of the element D forming part of the combination (s) being not lower than $1 \times 10^{18}$ cm$^{-3}$ and not higher than $1 \times 10^{22}$ cm$^{-3}$; an SiC layer formed on the first face; a first electrode formed on a first face side; and a second electrode formed on the second face.

The following is a description of embodiments, with reference to the accompanying drawings. In the following description, like components are denoted by like reference numerals, and explanation of components described once will not be repeated.

In the following description, $n^+$, n, $n^-$, $p^+$, p, and $p^-$ indicate relative levels of impurity densities in the respective conductivity types. Specifically, the concentration of an $n^+$-type impurity is relatively higher than the concentration of the corresponding n-type impurity, and the concentration of an $n^-$-type impurity is relatively lower than the concentration of the corresponding n-type impurity. Likewise, the concentration of a $p^+$-type impurity is relatively higher than the concentration of the corresponding p-type impurity, and the concentration of a $p^-$-type impurity is relatively lower than the concentration of the corresponding p-type impurity. It should be noted that there are cases where an $n^+$ type and an $n^-$ type are referred to simply as an n-type, and a $p^+$ type and a $p^-$ type are referred to simply as a p-type.

First Embodiment

A semiconductor device of this embodiment includes: an n-type SiC substrate that has first and second faces, and contains a p-type impurity and an n-type impurity, the p-type impurity being an element A, the n-type impurity being an element D, the element A and the element D being a combination of Al (aluminum), Ga (gallium), or In (indium) and N (nitrogen), and/or a combination of B (boron) and P (phosphorus), the ratio of the concentration of the element A to the concentration of the element D in the combination(s) being higher than 0.40 but lower than 0.95, the concentration of the element D forming part of the combination(s) being not lower than $1 \times 10^{18}$ cm$^{-3}$ and not higher than $1 \times 10^{22}$ cm$^3$; an SiC layer formed on the first face; a first electrode formed on the first face side; and a second electrode formed on the second face.

In the case of the first combination of Al (aluminum), Ga (gallium), or In (indium) and N (nitrogen), for example, the element A may be a single element selected from Al (aluminum), Ga (gallium), and In (indium). Alternatively, the element A may be formed with two elements such as Al (an element $A_1$) and Ga (an element $A_2$) or may be formed with three elements such as Al (the element $A_1$), Ga (the element $A_2$), and In (an element $A_3$). In a case where the element A is formed with more than one element, the element A may be formed with two or three kinds of elements, as long as the above described conditions on the ratio of the concentration of the element A to the concentration of the element D and on the concentration of the element D are satisfied.

The first combination and the second combination can coexist. However, the above described conditions on the ratio of the concentration of the element A to the concentration of the element D and on the concentration of the element D should be satisfied with elements that form at least one of the first and second combinations. In other words, each of the first combination and the second combination should satisfy the conditions on the element ratio and the element concentration. This is because the later described trimers are not formed between an impurity in the first combination and an impurity in the second combination.

In a case where the Al concentration is $1\times10^{18}$ cm$^{-3}$, the Ga concentration is $1\times10^{18}$ cm$^{-3}$, and the N concentration is $4\times10^{18}$ cm$^{-3}$, for example, (Al+Ga)/N is 0.5, and the N concentration is $4\times10^{18}$ cm$^{-3}$. In this case, the element ratio and the element densities are within the ranges set by this embodiment.

In a case where the B concentration is $1\times10^{18}$ cm$^{-3}$, the P concentration is $1\times10^{18}$ cm$^{-3}$, and the N concentration is $1\times10^{18}$ cm$^{-3}$, for example, attention is paid only to B and P, which is the second combination. In this case, B/P is 1.0, which does not satisfy the element ratio condition, and is outside the range set by this embodiment.

Also, in a case where the Al concentration is $2.5\times10^{17}$ cm$^{-3}$, the B concentration is $2.5\times10^{17}$ cm$^{-3}$, the N concentration is $5\times10^{17}$ cm$^{-3}$, and the P concentration is $5\times10^{17}$ cm$^{-3}$, for example, Al/N is 0.5, which satisfies the ratio condition, but the N concentration is lower than $1\times10^{18}$ cm$^{-3}$ in the first combination. In the second combination, B/P is 0.5, which satisfies the ratio condition, but the P concentration is lower than $1\times10^{18}$ cm$^{-3}$. Therefore, either of the first and second combinations does not satisfy the element ratio condition and the element concentration condition, and is outside the range set by the embodiment.

It should be noted that this embodiment does not exclude elements other than the above mentioned elements as p-type impurities and n-type impurities. In the following, an example case where the element A is Al and the element D is N is described.

FIG. 1 is a schematic cross-sectional view of the semiconductor device of this embodiment. The semiconductor device of this embodiment is a PiN diode.

This PiN diode 100 includes an n-type SiC substrate (a silicon carbide substrate) 12 having first and second faces. In FIG. 1, the first face is the upper face, and the second face is the lower face.

The n-type SiC substrate 12 is a 4H—SiC substrate, for example. The n-type SiC substrate 12 contains Al (aluminum) as the p-type impurity and N (nitrogen) as the n-type impurity.

The ratio of the Al concentration to the N concentration (Al concentration/N concentration) in the n-type SiC substrate 12 is higher than 0.40 but lower than 0.95. The N concentration is not lower than $1\times10^{18}$ cm$^{-3}$ and not higher than $1\times10^{22}$ cm$^{-3}$. The N concentration may be a constant value within the above range, or may exhibit a concentration gradient within the above range. The film thickness of the n-type SiC substrate 12 may be 300 to 700 μm, for example.

An n-type SiC layer (an n$^-$-SiC layer) 14 is formed on the first face of the SiC substrate 12. The concentration of the n-type impurity in the n$^-$-SiC layer 14 is lower than that in the n-type SiC substrate 12, and is approximately $5\times10^{15}$ to $2\times10^{16}$ cm$^{-3}$, for example. The n-type impurity is N, for example. The film thickness of the n$^-$-SiC layer 14 is approximately 5 to 50 μm, for example.

A p-type SiC layer (a p$^+$-type SiC layer) 16 is formed on the n$^-$-SiC layer 14. The concentration of the p-type impurity in the p$^+$-type SiC layer 16 is approximately $5\times10^{18}$ to $5\times10^{21}$ cm$^{-3}$, for example. The p-type impurity is Al, for example. The film thickness of the p$_+$-type SiC layer 16 is approximately 1 to 5 μm, for example.

A conductive first electrode (an anode electrode) 44 that is electrically connected to the p$^+$-type SiC layer 16 is provided on the p$^+$-type SiC layer 16. The first electrode 44 is made of a metal such as Ti (titanium), Ni (nickel), or Al (aluminum), or a metal compound, for example. The first electrode 44 is in ohmic contact with the p$^+$-type SiC layer 16.

Meanwhile, a conductive second electrode (a cathode electrode) 46 is formed on the second face of the n-type SiC substrate 12. The second electrode 46 is made of a metal such as Ti (titanium), Ni (nickel), or Al (aluminum), or a metal compound, for example. The second electrode 46 is in ohmic contact with the n-type SiC substrate 12.

In the following, the function and effects of this embodiment are described in detail.

It has become apparent from the results of studies made by the inventors that pairing between Al and N can be caused by co-doping SiC with Al as the p-type impurity (p-type dopant) and N as the n-type impurity (n-type dopant). In this pairing state, carrier compensation occurs, and a zero-carrier state is formed.

Figure 2:
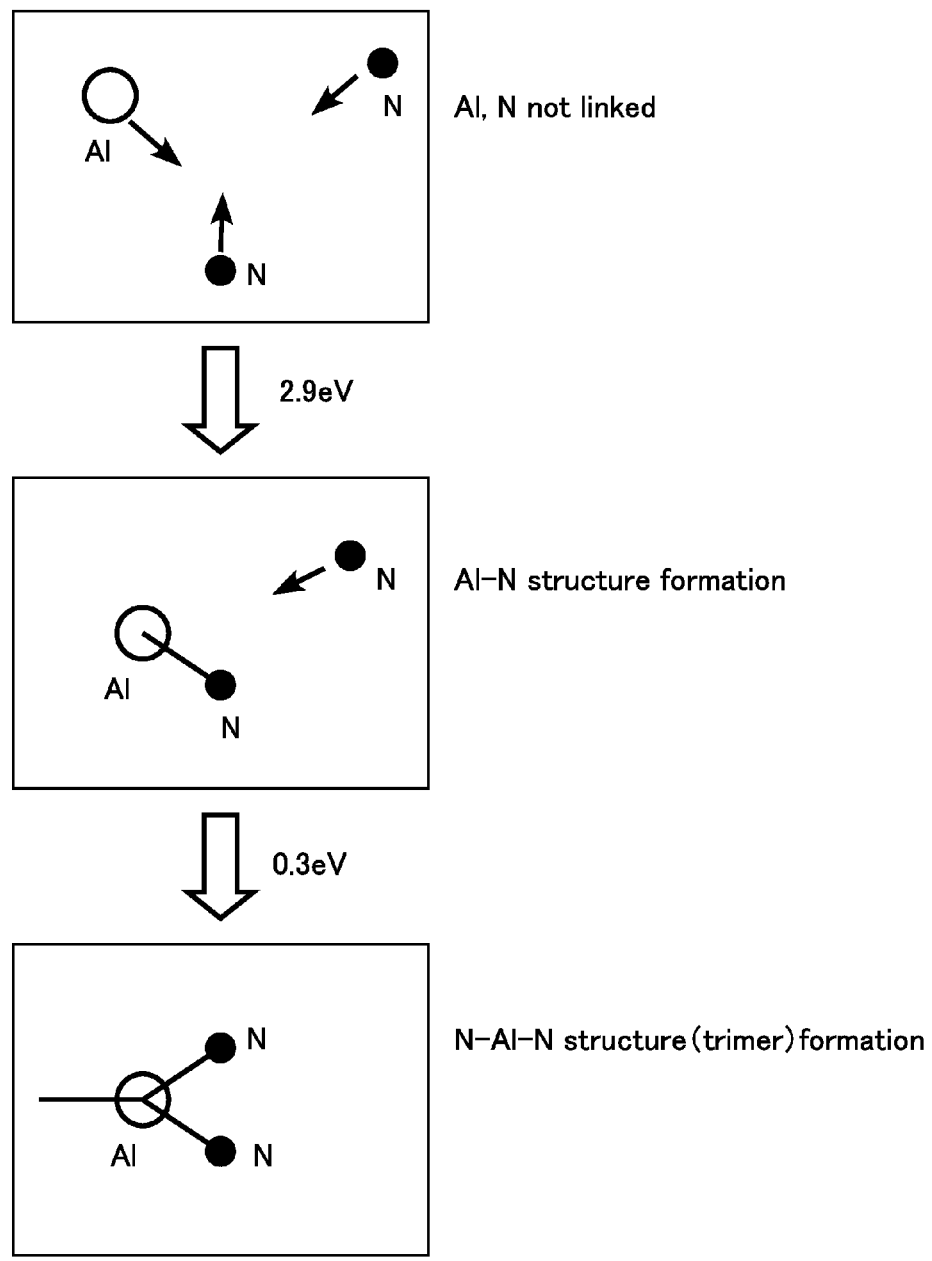
FIG. 2 is a diagram for explaining the function of co-doping.
Figure 3:
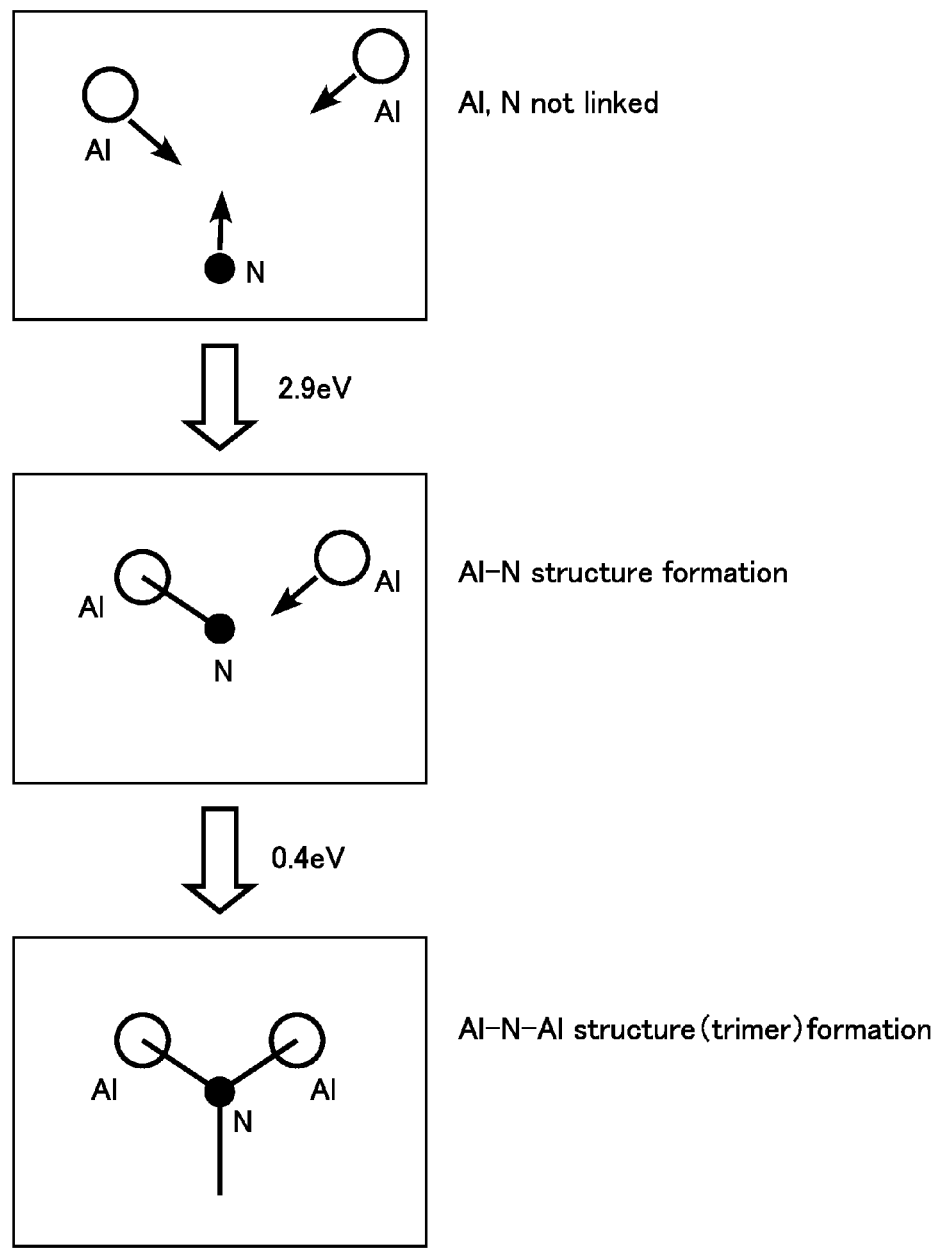
FIG. 3 is a diagram for explaining the function of co-doping.

FIGS. 2 and 3 are diagrams for explaining the function of co-doping. FIG. 2 shows the case of n-type SiC, and FIG. 3 shows the case of p-type SiC. It has become apparent from the first principle calculation performed by the inventors that Al enters Si (silicon) sites and N enters C (carbon) sites in SiC so that Al and N become adjacent to each other, and, as a result, the system becomes more stable.

Specifically, as shown in FIGS. 2 and 3, where Al and N are linked to each other to form Al—N pair structures, the system becomes 2.9 eV more stable in terms of energy than that in a situation where Al and N are not linked to each other but exist independently of each other. If the Al amount and the N amount are the same, the most stable state is achieved when all of the two elements form pair structures.

Here, the first principle calculation is a calculation using ultrasoft pseudopotential. Ultrasoft pseudopotential is a type of pseudopotential, and was developed by Vanderbilt et al. For example, a lattice constant has such a high precision as to realize experimental values with a margin of error of 1% or less. Structural relaxation is achieved by introducing impurities (dopant), and the entire energy of a stable state is calculated. The energy of the entire system after a change is compared with the energy prior to the change, so as to determine which structures are in a stable state. In a stable state, in which energy positions impurity levels are located in the band gap can be indicated.

As shown in FIG. 2, it has become apparent that, in a case where the amount of N is larger than the amount of Al, or in the case of n-type SiC, extra N enters C sites located in the vicinities of Al—N pair structures, to form N—Al—N trimers and further stabilize the system. According to the first principle calculation, trimers are formed, and the system becomes 0.3 eV more stable than that in a case where pair structures exist separately from N.

Likewise, as shown in FIG. 3, it has become apparent that, in a case where the amount of Al is larger than the amount of N, or in the case of p-type SiC, extra Al enters Si sites located in the vicinities of Al—N pair structures, to form Al—N—Al trimers and further stabilize the system. According to the first principle calculation, trimers are formed, and the system becomes 0.4 eV more stable than that in a case where Al—N pair structures exist separately from Al.

Next, dopant combinations other than the combination of Al and N are discussed. Calculation results obtained in a case where a calculation was conducted for a combination of B (boron) and N (nitrogen) are described below.

B enters Si sites, and N enters C sites. According to the first principle calculation, B—N—B or N—B—N trimeric structures cannot be formed. Specifically, B—N pair structures are formed, but the energy of the system becomes higher when B or N approaches the B—N pair structures. Accordingly, the system is more stable in terms of energy when extra B or N exists independently in positions sufficiently away from the pair structures.

According to the first principle calculation, when extra B forms trimers, the energy of the system is 0.5 eV higher than that in a case where B—N pairs exist independently of B. Also, when extra N forms trimers, the energy of the system is 0.3 eV higher than that in a case where B—N pairs exist independently of N. Therefore, in either case, the system becomes unstable in terms of energy when trimers are formed.

Figure 4:
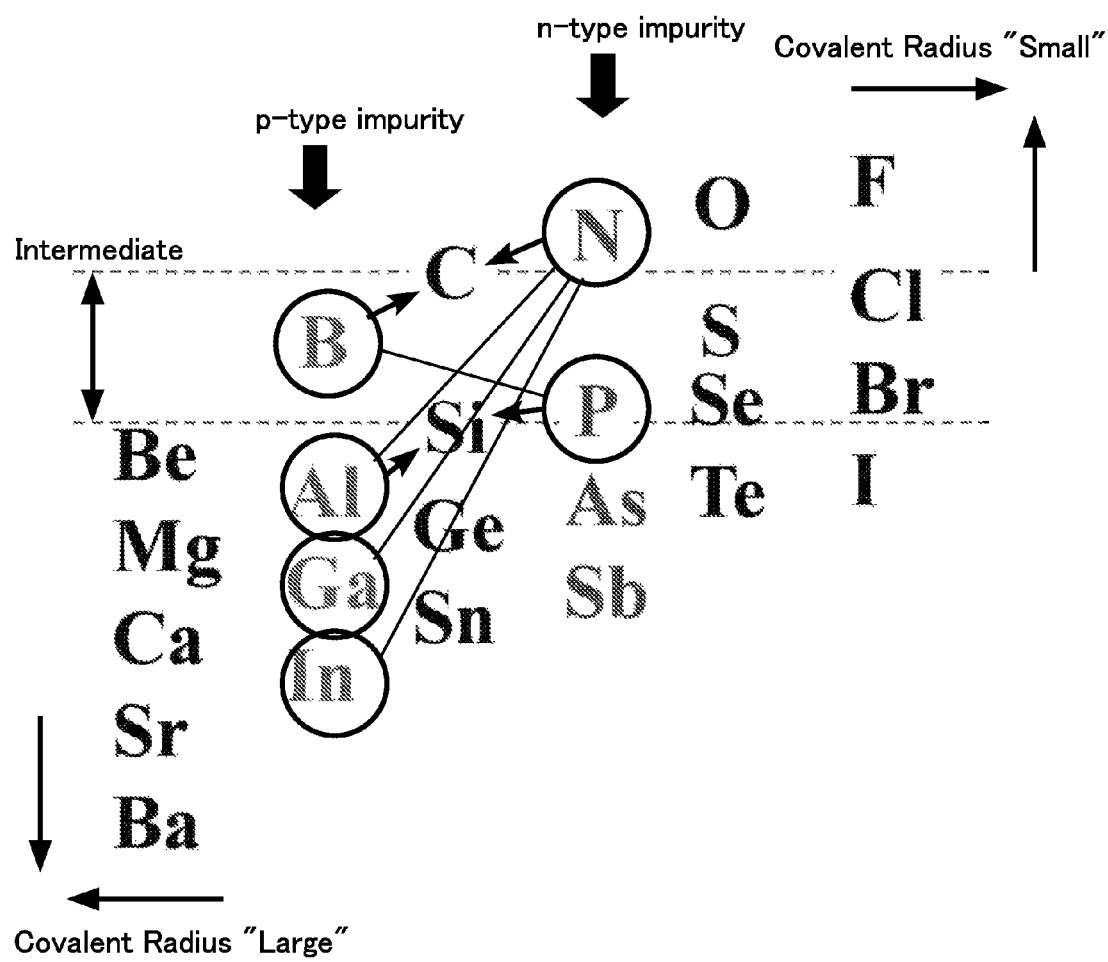
FIG. 4 is a diagram for explaining the function of co-doping.

FIG. 4 is a diagram for explaining the function of co-doping. FIG. 4 shows the covalent radii of respective elements. Elements with smaller covalent radii are shown in the upper right portion in the drawing, and elements with larger covalent radii are shown in the lower left portion.

Considering the covalent radii, it is understandable that the system becomes unstable when trimers are formed with B and N. The covalent radius of B is smaller than the covalent radius of Si, and the covalent radius of N is smaller than the covalent radius of C. Therefore, when B enters Si sites and N enters C sites, strain accumulates, and trimers cannot be formed.

It has become apparent that trimers are not formed with combinations of the p-type impurity and the n-type impurity as dopant other than the combinations of "an element (Al, Ga, or In) having a larger covalent radius than that of Si" and "an element (N) having a smaller covalent radius than that of C", and the reverse combination of "an element (B) having a larger covalent radius than that of C" and "an element (P) having a smaller covalent radius than that of Si".

Since the covalent radii of B and P are between the covalent radius of Si and the covalent radius of C, B and P can enter both Si sites and C sites. However, the other impurities (Al, Ga, In, N, and As) basically enter either Si sites or C sites. It is safe to say that Al, Ga, In, and As enter Si sites, and N enters C sites.

Furthermore, when both impurities enter Si sites or both impurities enter C sites, there is no need to take into account such an aspect. This is because it is difficult to relax strain unless the p-type impurity and the n-type impurity are located at the closest distance from each other. Therefore, where the p-type impurity is the element A and the n-type impurity is the element D, it is difficult to form trimers with combinations of the element A and the element D other than the four combinations of "Al and N", "Ga and N", "In and N", and "B and P".

The pair structures or the trimeric structures cannot be formed unless there is interaction between atoms. If approximately 10 unit cells exist in the c-axis direction, the interaction is invisible, and the impurity levels (dopant levels) in a 4H—SiC structure according to the first principle calculation are in a flat state. That is, diffusion is sufficiently restrained, and is on the order of approximately 10 meV.

In other words, it is considered that there is little interaction when the distance between impurities is 10 nm or longer. In view of this, to maintain interaction between impurities, the impurity densities are preferably $1\times10^{18}$ cm$^{-3}$ or higher.

This value is the lower limit of impurity densities that is desired when a local impurity distribution is formed through ion implantation in a case where an SiC material has already been formed.

To cause an effect of co-doping to appear in semiconductor SiC, the ratio between the n-type impurity concentration and the p-type impurity concentration needs to be restricted within a specific range. By the later described manufacturing method, it is critical that the ratio between the n-type and p-type impurities to be introduced by ion implantation be set at a ratio within the specific range from the start. Although the reach of interaction is as short as less than 10 nm, trimers can be formed by virtue of the attraction force of each other within the reach. Furthermore, as the attraction force is applied, the temperature of the activating anneal for the impurities can be lowered from 1700-1900° C., which is the temperature range in a case where co-doping is not performed, to 1500-1800° C.

However, the impurity concentration desirable for trimer formation can be lowered in crystal growth from a vapor phase by CVD (Chemical Vapor Deposition) or the like. This is because raw material can be made to flow in the surface, and accordingly, interaction between the impurities can easily occur at low densities.

In vapor phase growth, the range of impurity densities for trimer formation is $1\times10^{16}$ cm$^{-3}$ to $1\times10^{22}$ cm$^{-3}$, which is wider than that with ion implantation. In vapor phase growth, it is possible to lower the impurity concentration in SiC to approximately $1\times10^{16}$ cm$^{-3}$ or increase the impurity concentration in SiC to approximately $1\times10^{21}$ cm$^{-3}$, for example. Particularly, it is difficult to form a low-concentration region through ion implantation. Therefore, impurity region formation through vapor phase growth is particularly effective in a low-concentration region. Furthermore, it is possible to form a co-doped film as thin as 5 nm, for example, through vapor phase growth.

Vapor phase growth also has the advantage that defects in crystals are not easily formed in regions containing impurities at high densities. In the case of ion implantation, defects in crystals increase as the amount of introduced impurities becomes larger, and recovery through a heat treatment or the like also becomes difficult. By vapor phase growth, trimers are formed during the growth, and defects due to impurity implantation are hardly formed. In view of this, impurity region formation through vapor phase growth is effective in regions having impurity densities of $1\times10^{19}$ cm$^{-3}$ or higher, or more preferably, $1\times10^{20}$ cm$^{-3}$ or higher, for example.

As described above, vapor phase growth has effects that cannot be achieved by ion implantation. However, impurity regions that are locally co-doped can be formed through ion implantation. Also, co-doped impurity regions can be formed at low costs. Therefore, either vapor phase growth or ion implantation should be used where appropriate.

When trimers are to be formed at the time of crystal growth from a vapor phase, the densities of the p-type and n-type impurities are preferably $1\times10^{16}$ cm$^{-3}$ or higher. Further, so as to facilitate the trimer formation, the impurity densities are preferably $1\times10^{16}$ cm$^{-3}$ or higher.

When trimers are formed, the upper limit of impurity densities may exceed the solid solubility limit of cases where trimers are not formed. This is because, when trimers are formed, strain in crystals is relaxed, and the impurities are easily solved.

The impurity solid solubility limit in a case where trimers are not formed is on the order of $10^{19}$ cm$^{-3}$ in the case of N, and is on the order of $10^{21}$ cm$^{-3}$ even in the case of Al. As for the other impurities, the solid solubility limit is on the order of approximately $10^{21}$ cm$^{3}$.

When only one type of impurity is used, the size of the impurity is either small or large. Therefore, strain accumulates, and the impurity cannot easily enter lattice points. As a result, activation cannot be caused. Particularly, in the case of ion implantation, a large number of defects are formed, and the solid solubility limit becomes even lower.

However, when trimers are formed, both Al and N can be implanted up to the order of approximately $10^{22}$ cm$^3$. As strain can be relaxed by forming trimers with one of the four combinations of "Al and N", "Ga and N", "In and N", and "B and P", the solid solubility limit can be extended. As a result, the impurity solid solubility limit can be extended to the order of $10^{22}$ cm$^3$.

In a case where the impurity is B, Al, Ga, In, or P, strain is large, and a large number of defects exist, if the impurity concentration is $1\times10^{20}$ cm$^{-3}$ or higher, or more particularly, $6\times10^{20}$ cm$^{-3}$ or higher. As a result, sheet resistance or resistivity becomes very high.

However, co-doping with the p-type impurity and the n-type impurity can reduce defects even in regions having such high impurity densities.

When an impurity is N, the solid solubility limit is further lowered by one digit to approximately $2\times10^{19}$ cm$^{-3}$. According to the first principle calculation, this is probably because defects of inactive interstitial N are formed.

As trimers are formed, the upper limit of the N concentration is dramatically increased from the order of $10^{19}$ cm$^{-3}$ to the order of $10^{22}$ cm$^{-3}$. In a case where an n-type region doped at a high concentration is to be formed, nitrogen cannot be normally used, and P ions are implanted at approximately $10^{20}$ cm$^{-3}$, for example. In this embodiment, however, an n-type region doped at a high concentration can be formed by using nitrogen. For example, N is implanted at $2\times10^{20}$ cm$^{-3}$, and Al is implanted at $1\times10^{20}$ cm$^{-3}$. It is normally difficult to use nitrogen, but nitrogen can be used in this embodiment.

As described above, both the p-type impurity and the n-type impurity are implanted, and an appropriate combination of covalent radii is selected, so that trimers can be formed. The structures are then stabilized, and strain can be reduced.

As a result, (1) the respective impurities can easily enter lattice points, (2) the process temperature can be lowered, and a temperature decrease of at least 100° C. can be expected, (3) the amount of impurities that can be activated increases (the upper limit is extended), (4) stable structures such as trimers or pair structures can be formed, and entropy is increased and crystal defects are reduced with the structures, and (5) as the trimers are stable, revolutions around the bonds that bind the p-type impurity and the n-type impurity become difficult, and the structures are immobilized. Accordingly, energization breakdown tolerance becomes dramatically higher. For example, when trimeric structures are formed in at least part of the p-type impurity region and the n-type impurity region of a pn junction, energization breakdown is restrained, and an increase in resistance can be avoided. As a result, a degradation phenomenon (Vf degradation) in which the voltage (Vf) required to be applied so as to apply a certain amount of current becomes higher can be restrained.

As described above, pairing between Al and N can be caused by co-doping with Al as the p-type impurity and N as the n-type impurity. Furthermore, it has become apparent from the first principle calculation that both acceptor levels and donor levels can be made shallower at this point.

Figure 5:
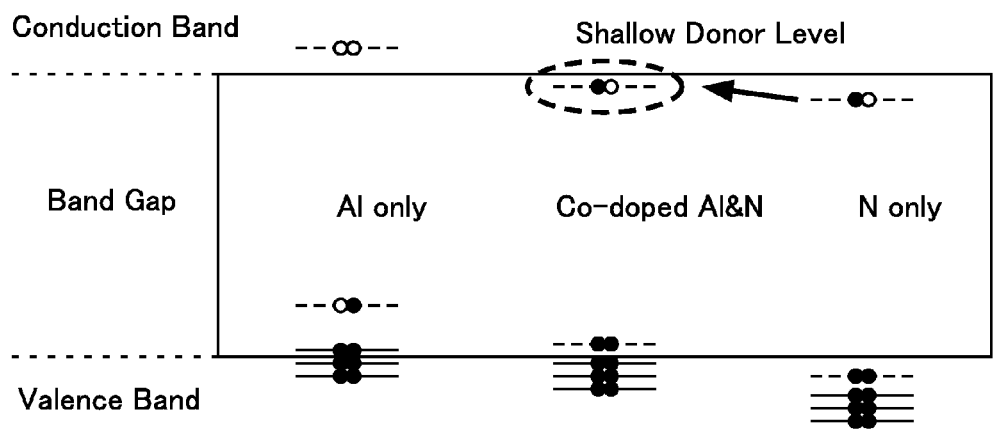
FIG. 5 is a diagram for explaining the function of co-doping.
Figure 6:
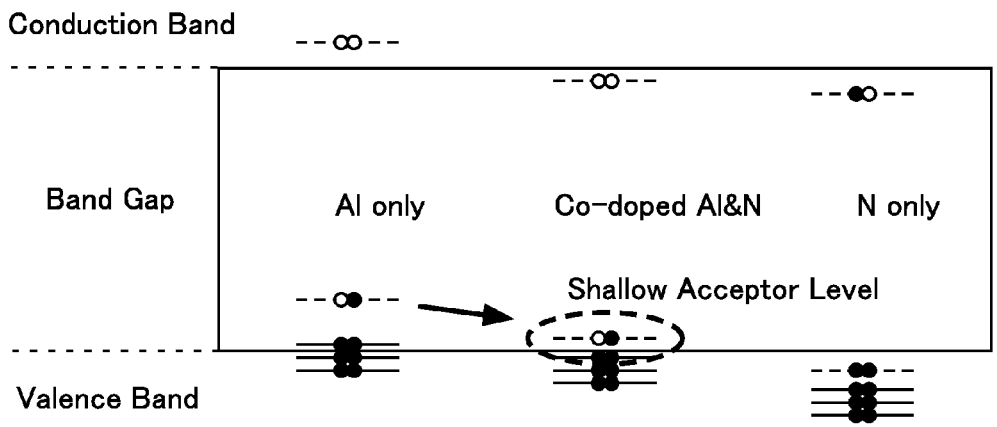
FIG. 6 is a diagram for explaining the function of co-doping.

FIGS. 5 and 6 are diagrams for explaining the function of co-doping. FIG. 5 illustrates a case of n-type SiC, and FIG. 6 illustrates a case of p-type SiC. White circles represent empty levels not filled with electrons, and black circles represent levels filled with electrons.

The reason that the donor levels become shallower is that the empty levels located within the conduction band of Al as the acceptor interact with the donor levels of N, and the donor levels are raised, as shown in FIG. 5. Likewise, the reason that the acceptor levels become shallower is that the levels that are filled with electrons and are located within the valence band of N as the donor interact with the acceptor levels of Al, and the acceptor levels are lowered, as shown in FIG. 6.

Normally, N or P (phosphorus) as the n-type impurity forms donor levels that are as deep as 42 to 95 meV. B, Al, Ga, or In as the p-type impurity forms very deep acceptor levels of 160 to 300 meV. If trimers are formed, on the other hand, the n-type impurity can form donor levels of 35 meV or shallower, and the p-type impurity can form acceptor levels of 100 meV or shallower.

In an optimum state where trimers are completely formed, n-type N or P forms levels of approximately 20 meV, and p-type B, Al, Ga, or In forms levels of approximately 40 meV. As such shallow levels are formed, most of the activated impurities turn into carriers (free electrons and free holes). Accordingly, the bulk resistance becomes one or more digits lower than that in a case where co-doping is not performed.

In the case of n-type SiC, the donor levels that contribute to carrier generation becomes 40 meV or shallower, and as a result, the resistance becomes lower than that in a case where co-doping is not performed. Also, as the donor levels become 35 meV or shallower, the resistance is lowered by approximately one digit. As the donor levels become 20 meV or shallower, the resistance is lowered by approximately two digits. However, a strain relaxation effect and a doping upper limit extension effect are also achieved.

In the case of p-type SiC, the acceptor levels that contribute to carrier generation becomes 150 meV or shallower, and as a result, the resistance becomes lower than that in a case where co-doping is not performed. Also, as the acceptor levels become 100 meV or shallower, the resistance is lowered by approximately one digit. As the acceptor levels become 40 meV or shallower, the resistance is lowered by approximately two digits. However, a strain relaxation effect and a doping upper limit extension effect are also achieved.

When the Al concentration and the N concentration are the same (N:Al=1:1), an insulator is formed, because there are no carriers though there are shallow levels. There exist carriers that are equivalent to a difference between the Al concentration and the N concentration. To form a low-resistance semiconductor, a concentration difference is required.

When the N concentration is higher than the Al concentration (N concentration>Al concentration), extra N generated as a result of formation of Al—N pairs through interaction is also stabilized by displacing C located in the vicinities of the Al—N pairs. Accordingly, shallow donor levels are formed. Also, strain is relaxed. Accordingly, the N concentration can be made higher than that in a case where trimers are not formed.

Figure 7:
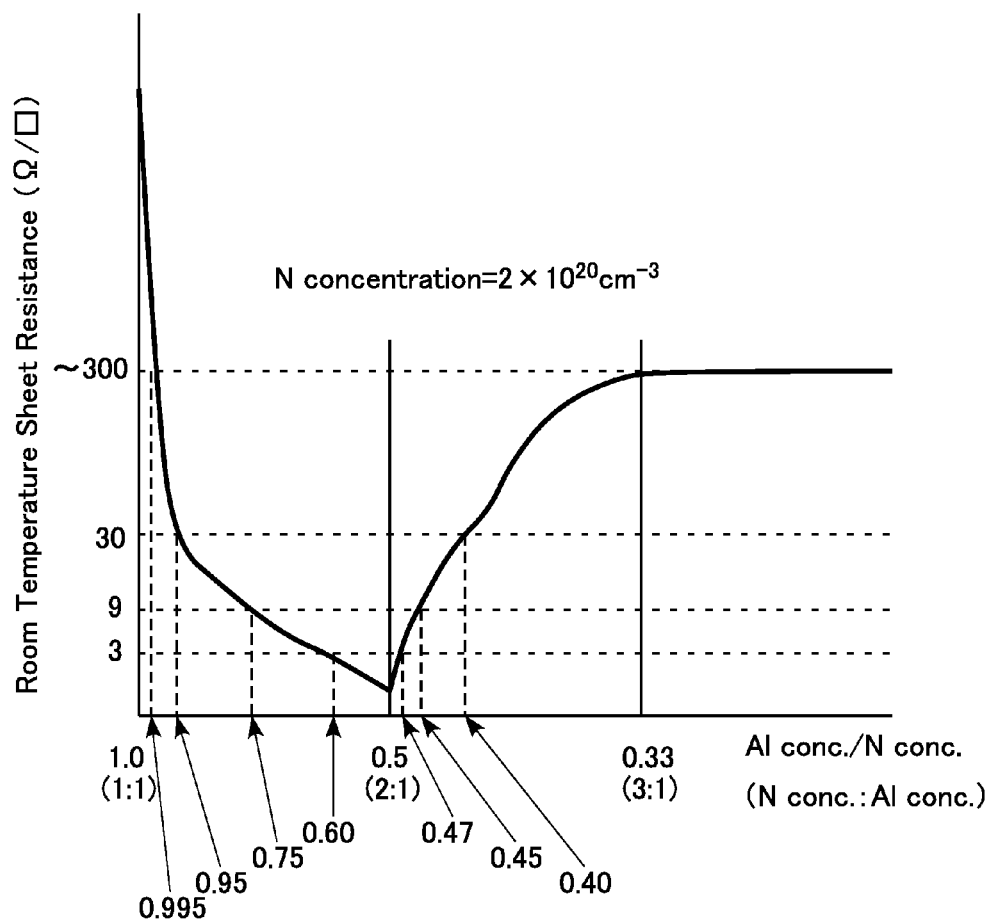
FIG. 7 is a diagram showing the relationship between Al and N densities and sheet resistance in the case of n-type SiC.

FIG. 7 is a diagram showing the relationship between Al and N densities and sheet resistance in the case of n-type SiC. The N concentration is $2\times10^{20}$ cm$^{-3}$. When only N is implanted, the sheet resistance cannot be lowered even if N is implanted at $1\times10^{19}$ cm$^{-3}$ or higher. The value is approximately 300 Ω/□.

While "N concentration:Al concentration" is changing from 1:1 to 2:1, trimers are formed without strain, and the number of carrier electrons in the shallow donor levels increases. Accordingly, the sheet resistance rapidly decreases.

When the ratio reaches 2:1, the maximum amount of carriers is available, and the sheet resistance becomes lowest. As shown in FIG. 7, the sheet resistance can be lowered down to approximately 1.5 Ω/□. The contact resistance to n-type SiC can also be lowered from approximately $10^{-5}$ Ωcm$^3$ to approximately $10^{-7}$ Ωcm$^3$ by making "N concentration:Al concentration" equal to 2:1 and increasing the difference between the N concentration and the Al concentration from $10^{20}$ cm$^{-3}$ to $10^{22}$ cm$^{-3}$.

Furthermore, if the ratio of the N concentration becomes higher than 2:1, the original deep donor levels are formed by the extra N that exceeds "N concentration:Al concentration=2:1". The donor levels receive carrier electrons, and the shallow donor levels formed with trimers become empty. The excess N left out from "N concentration:Al concentration=2:1" is similar to N introduced independently. Therefore, strain relaxation is difficult. As a result, the sheet resistance rapidly increases as shown in FIG. 7.

In FIG. 7, the target for comparison is the sheet resistance (approximately 300 Ω/□ in this case) in a case where N (nitrogen) as the n-type impurity is implanted almost up to the solid solubility limit when co-doping with Al is not performed, and changes in the sheet resistance value seen when "N concentration:Al concentration" is changed from 2:1 are shown.

The following description centers around "Al concentration/N concentration=0.5", at which trimer structures are formed. In a case where "Al concentration/N concentration" is not lower than 0.47 and not higher than 0.60 (100% of the carriers of $8\times10^{19}$ cm$^{-3}$ or higher being free carriers), or where the p-type impurity is implanted at 47 to 60% with respect to the n-type impurity, the sheet resistance is two digits lower than the sheet resistance obtained in a case co-doping with Al is not performed. Such a concentration ratio is highly advantageous. When the ratio is lower than 0.5, shallow levels decrease, and strain is caused. As a result, the number of free carriers decreases, and carriers equivalent to $8\times10^{19}$ cm$^{-3}$ are obtained when the ratio is approximately 0.47.

In a case where the range is widened in both directions, and "Al concentration/N concentration" is not lower than 0.45 and not higher than 0.75 (100% of the carriers of $5\times10^{19}$ cm$^{-3}$ or higher being free carriers), or where Al is implanted at 45 to 75% with respect to N, the sheet resistance ranges from a two-digit-lower resistance to a resistance almost three times higher than the two-digit-lower resistance. When the ratio is lower than 0.5, shallow levels decrease, and strain is caused. As a result, the number of free carriers decreases, and carriers equivalent to $5\times10^{19}$ cm$^{-3}$ are obtained when the ratio is approximately 0.45. In a case where the range is further widened in both directions and "Al concentration/N concentration" is higher than 0.40 but lower than 0.95 (100% of the carriers of $1\times10^{19}$ cm$^{-3}$ or higher being free carriers), or where Al is implanted at 40 to 95% with respect to N, the sheet resistance becomes one digit lower. When the ratio is lower than 0.5, shallow levels decrease, and strain is caused. As a result, the number of free carriers decreases, and carriers equivalent to $1\times10^{19}$ cm$^{-3}$ are obtained when the ratio is approximately 0.40.

Better characteristics are achieved on the side where Al is implanted at 50% or more with respect to N, because strain is sufficiently relaxed. The 50% state is the state where two N atoms and one Al atom are clustered to form a trimer. When the ratio is lower than 50%, trimers are formed, and extra N exists. Since there is N that cannot form trimers, an equivalent amount of strain accumulates. N that cannot form trimers is the same as that introduced independently, and reaches the limit of strain in no time. When the amount of Al is lower than 50%, strain rapidly occurs, and lattice defects increase. Therefore, the sheet resistance rapidly deteriorates when the ratio is lower than 50%, compared with that in a case where the ratio is 50% or higher at which strain can be relaxed.

When "Al concentration/N concentration" is 0.995, the number of carriers is almost the same as that in a case where co-doping is not performed. Since 100% of the carriers of $1\times10^{18}$ cm$^{-3}$ or higher, which is 0.5% of $2\times10^{20}$ cm$^{-3}$, are free carriers, the sheet resistance to be obtained with conventional nitrogen doping can be realized. Accordingly, the sheet resistance is almost the same as that in a case where co-doping is not performed. In a case where "Al concentration/N concentration" is 0.33 or where "N concentration:Al concentration" is 3:1, all carrier electrons are received not by shallow donor levels formed with trimers but by deep donor levels formed with extra N. Accordingly, the sheet resistance is almost the same as that in a case where co-doping is not performed. Therefore, a resistance lowering effect is achieved by co-doping in cases where "Al concentration/N concentration" is higher than 0.33 but lower than 0.995, or where Al is implanted at 33 to 99.5% with respect to N. With the margin of error being taken into account, it can be considered that the ratio of Al to N should be higher than 33% but lower than 100%.

When the Al concentration is higher than the N concentration (Al concentration>N concentration), extra Al generated as a result of formation of Al—N pairs through interaction is also stabilized by displacing Si located in the vicinities of the Al—N pairs. Accordingly, shallow acceptor levels are formed. Also, strain is relaxed. Accordingly, the Al concentration can be made higher than that in a case where trimers are not formed. This case can be considered to be the same as the case where the N concentration is higher than the Al concentration.

Figure 8:
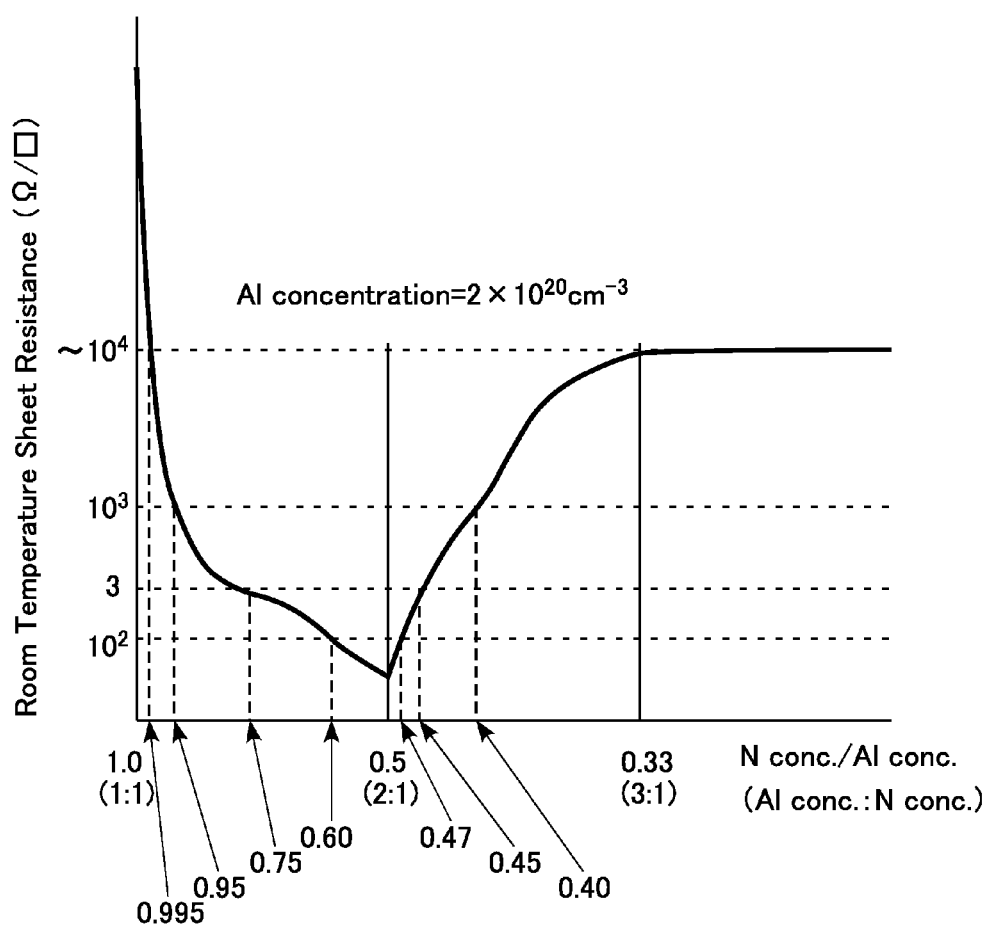
FIG. 8 is a diagram showing the relationship between N and Al densities and sheet resistance in the case of p-type SiC.

FIG. 8 is a diagram showing the relationship between N and Al densities and sheet resistance in the case of p-type SiC. The Al concentration is $2\times10^{20}$ cm$^{-3}$.

While "Al concentration:N concentration" is changing from 1:1 to 2:1, trimers are formed without strain, and the number of carrier holes in the shallow acceptor levels increases. Accordingly, the sheet resistance decreases.

When the ratio reaches 2:1, the maximum amount of carriers is available, and the sheet resistance becomes lowest. As shown in FIG. 8, the sheet resistance can be lowered down to approximately 40 Ω/□. The contact resistance to p-type SiC can also be lowered from approximately $10^{-5}$ Ωcm$^3$ to approximately $10^{-7}$ Ωcm$^3$ by making "Al concentration:N concentration" equal to 2:1 and increasing the difference between the Al concentration and the N concentration from $10^{20}$ cm$^{-3}$ to $10^{22}$ cm$^{-3}$.

Furthermore, if the ratio of the Al concentration becomes higher than 2:1, the original deep acceptor levels are formed by the extra Al that exceeds "Al concentration N concentration=2:1". The acceptor levels receive carrier holes, and the shallow acceptor levels formed with trimers are filled with electrons. The excess Al left out from "Al concentration:N concentration=2:1" is similar to N introduced independently. Therefore, strain relaxation is difficult. As a result, the sheet resistance rapidly increases as shown in FIG. 8.

In FIG. 8, the target for comparison is the sheet resistance (approximately 10 KΩ/□ in this case) in a case where Al (aluminum) as the p-type impurity is implanted almost up to the solid solubility limit when co-doping with N is not performed, and changes in the sheet resistance value seen when "Al concentration:N concentration" is changed from 2:1 are shown.

The following description centers around "N concentration/Al concentration=0.5", at which trimer structures are formed. In a case where "N concentration/Al concentration" is not lower than 0.47 and not higher than 0.60 (100% of the carriers of $8\times10^{19}$ cm$^{-3}$ or higher being free carriers), or where the n-type impurity is implanted at 47 to 60% with respect to the p-type impurity, the sheet resistance is two digits lower than the sheet resistance obtained in a case co-doping with N is not performed. Such a concentration ratio is highly advantageous. When the ratio is lower than 0.5, shallow levels decrease, and strain is caused. As a result, the number of free carriers decreases, and carriers equivalent to $8\times10^{19}$ cm$^{-3}$ are obtained when the ratio is approximately 0.47.

In a case where the range is widened in both directions, and "N concentration/Al concentration" is not lower than 0.45 and not higher than 0.75 (100% of the carriers of $5\times10^{19}$ cm$^{-3}$ or higher being free carriers), or where N is implanted at 45 to 75% with respect to Al, the sheet resistance ranges from a two-digit-lower resistance to a resistance almost three times higher than the two-digit-lower resistance. When the ratio is lower than 0.5, shallow levels decrease, and strain is caused. As a result, the number of free carriers decreases, and carriers equivalent to $5\times10^{19}$ cm$^{-3}$ are obtained when the ratio is approximately 0.45. In a case where the range is further widened in both directions and "N concentration/Al concentration" is higher than 0.40 but lower than 0.95 (100% of the carriers of $1\times10^{19}$ cm$^{-3}$ or higher being free carriers), or where N is implanted at 40 to 95% with respect to Al, the sheet resistance becomes one digit lower. When the ratio is lower than 0.5, shallow levels decrease, and strain is caused. As a result, the number of free carriers decreases, and carriers equivalent to $1\times10^{19}$ cm$^{-3}$ are obtained when the ratio is approximately 0.40.

Better characteristics are achieved in cases where N is implanted at 50% or more with respect to Al, because strain is sufficiently relaxed. When N is less than 50%, on the other hand, trimers formed with one N atom and two Al atoms that are clustered account for 50% of the entire structure, and further, Al exists therein. Since there is Al that cannot form trimers, an equivalent amount of strain accumulates. When the amount of N is lower than 50%, strain rapidly occurs, and lattice defects increase. Therefore, the sheet resistance rapidly deteriorates when the ratio is lower than 50%, compared with that in a case where the ratio is 50% or higher at which strain can be relaxed.

At this point, "N concentration/Al concentration" is 0.995, and the number of carriers is almost the same as that in a case where co-doping is not performed. Since 100% of the carriers of $1\times10^{18}$ cm$^{-3}$ or higher, which is 0.5% of $2\times10^{20}$ cm$^{-3}$, are free carriers, the sheet resistance to be achieved with conventional Al doping can be realized. Accordingly, the sheet resistance is almost the same as that in a case where co-doping is not performed. In a case where "N concentration/Al concentration" is 0.33 or where "Al concentration:N concentration" is 3:1, all carrier holes are received not by shallow acceptor levels formed with trimers but by deep acceptor levels formed with extra Al. Accordingly, the sheet resistance is almost the same as that in a case where co-doping is not performed. Therefore, the resistance is lowered by co-doping in cases where "N concentration/Al concentration" is higher than 0.33 but lower than 0.995, or where N is implanted at 33 to 99.5% with respect to Al. With the margin of error being taken into account, it can be considered that the ratio of N to Al should be higher than 33% but lower than 100%.

When co-doping is not performed, a low-resistance SiC semiconductor material containing impurities having low densities of $1\times10^{18}$ cm$^{-3}$ or lower cannot exist. However, when trimers are formed by co-doping, shallow levels are formed, and the number of carriers increases. Accordingly, a reduction in resistance can be achieved with small amounts of impurities.

Co-doping with the p-type impurity and the n-type impurity at an appropriate ratio as described above can achieve at least two notable effects.

First, strain is relaxed, and SiC with less strain can be formed. Compared with a case where co-doping is not performed, strain is smaller, the number of defects is smaller, and larger amounts of impurities can be implanted. That is, the solid solubility limits of impurities can be raised. Accordingly, the sheet resistance, the resistivity, and the contact resistance are lowered. As fewer defects are formed by either ion implantation or epitaxial growth, dosing of large amounts of impurities can be performed.

Secondly, shallow levels can be formed. Compared with a case where co-doping is not performed, a low-resistance material can be formed with smaller amounts of impurities. Alternatively, a sheet resistance that is one or more digits lower can be achieved with the same amounts of impurities as those in a case where co-doping is not performed. In a region that can be formed through epitaxial growth and contains a low-dose impurity, the resistance becomes higher unless co-doping is performed. However, low-resistance SiC can be formed when co-doping is performed. Accordingly, an SiC semiconductor device having a lower ON resistance can be manufactured.

In the PiN diode 100 of this embodiment, the n-type SiC substrate 12 is co-doped with Al as the p-type impurity and N as the n-type impurity at a desired ratio. Accordingly, the resistivity of the n-type SiC substrate 12 is lower than that in a case where co-doping is not performed. Also, the contact resistance between the second electrode 46 and the n-type SiC substrate 12 is lower than that in a case where co-doping is not performed. Accordingly, the ON resistance is lowered, and the PiN diode 100 with a large forward current is realized.

Furthermore, trimers are formed by co-doping, and strain in the n-type SiC substrate 12 is relaxed even when the impurity densities are high. For example, even when the impurity densities are $1\times10^{19}$ cm$^{-3}$ or higher, or $1\times10^{20}$ cm$^{-3}$ or higher, formation of crystal defects in the n-type SiC substrate 12 is restrained. As fewer crystal defects exist in the n-type SiC substrate 12, characteristics degradation due to crystal defects does not easily occur.

Accordingly, the PiN diode 100 having a smaller leakage current at the time of reverse bias is realized, for example. Alternatively, the high-voltage PiN diode 100 that excels in energization breakdown tolerance and has little Vf degradation is realized.

The concentration of N as the n-type impurity contained in the n-type SiC substrate 12 is not lower than $1\times10^{18}$ cm$^{-3}$ and not higher than $1\times10^{22}$ cm$^{-3}$. This is because, if the N concentration is below the range, the resistivity of the n-type SiC substrate 12 and the contact resistance between the second electrode 46 and the n-type SiC substrate 12 become higher, and the ON resistance might become too high. This is also because it is difficult to solve an n-type impurity having a concentration above the range. The N concentration may be a constant value within the above range, or may exhibit a concentration gradient within the above range.

So as to sufficiently lower the resistivity of the n-type SiC substrate 12 and the contact resistance between the second electrode 46 and the n-type SiC substrate 12, the concentration of the n-type impurity contained in the n-type SiC substrate 12 is preferably $1\times10^{19}$ cm$^{-3}$ or higher, or more preferably, $1\times10^{20}$ cm$^{-3}$ or higher.

So as to sufficiently lower the resistivity of the n-type SiC substrate 12 and the contact resistance between the second electrode 46 and the n-type SiC substrate 12, the ratio of the Al concentration to the N concentration (Al concentration/N concentration) in the n-type SiC substrate 12 is higher than 0.40 but lower than 0.95. Also, the ratio of the Al concentration to the N concentration is preferably not lower than 0.45 and not higher than 0.75. More preferably, the ratio is not lower than 0.47 and not higher than 0.60.

The ratio of the Al concentration to the N concentration can be calculated by determining the respective densities of Al and N by SIMS (Secondary Ion Microprobe Spectrometry), for example.

So as to sufficiently lower the resistivity of the n-type SiC substrate 12 and the contact resistance between the second electrode 46 and the n-type SiC substrate 12, the donor levels that contribute to generation of N carriers are preferably 40 meV or shallower. More preferably, the donor levels are 35 meV or shallower. Even more preferably, the donor levels are 20 meV or shallower.

The donor levels of N can be determined by measuring the activation energy of the sheet resistance or the resistivity of the n-type SiC substrate 12, or the contact resistance between the second electrode 46 and the n-type SiC substrate 12, for example.

So as to sufficiently lower the resistivity of the n-type SiC substrate 12 and the contact resistance between the second electrode 46 and the n-type SiC substrate 12, and realize a low ON resistance, most of the p-type impurity and the n-type impurity preferably form trimers. Therefore, 90% or more of Al is preferably in the lattice site locations nearest to N. If 90% or more of Al is in the lattice site locations nearest to N, most (90% or more) of Al and N can be considered to form trimers.

Of all Al, the proportion of the element in the lattice site locations nearest to N can be determined by analyzing the binding state between Al and N by XPS (X-ray Photoelectron Spectroscopy), for example.

Referring back to FIG. 1, an example of a method of manufacturing the semiconductor device of this embodiment is described.

A method of manufacturing the semiconductor device of this embodiment includes preparing an n-type SiC substrate that has first and second faces, and contains a p-type impurity and an n-type impurity, the p-type impurity being an element A, the n-type impurity being an element D, the element A and the element D being a combination of Al (aluminum), Ga (gallium), or In (indium) and N (nitrogen), and/or a combination of B (boron) and P (phosphorus), the ratio of the concentration of the element A to the concentration of the element D in the combination (s) being higher than 0.40 but lower than 0.95, the concentration of the element D forming part of the combination (s) being not lower than $1 \times 10^{18}$ cm$^{-3}$ and not higher than $1 \times 10^{22}$ cm$^{-3}$. An SiC layer is then formed on the first face, a first electrode is formed on the first face side, and a second electrode is formed on the second face.

In the following, an example case where the element A is Al and the element D is N is described.

First, the n-type SiC substrate 12 that has first and second faces, and contains Al (aluminum) and N (nitrogen) is prepared. The ratio of the Al concentration to the N concentration is higher than 0.40 but lower than 0.95, and the N concentration is not lower than $1 \times 10^{18}$ cm$^{-2}$ and not higher than $1 \times 10^{22}$ cm$^{-2}$. The n-type SiC substrate 12 is a substrate manufactured by epitaxial growth using high-temperature CVD (HTCVD), for example. The N concentration may be a constant value within the above range, or may exhibit a concentration gradient within the above range.

The n-type SiC layer (the n$^-$-SiC layer) 14 is then formed on the first face of the n-type SiC substrate 12. The n-type SiC layer (the n$^-$-SiC layer) 14 is formed through epitaxial growth using CVD, for example.

The p-type SiC layer (the p$^+$-type SiC layer) 16 is then formed on the n$^-$-SiC layer 14. The p-type SiC layer (the p$^+$-type SiC layer) 16 is formed through epitaxial growth using CVD, for example.

The first electrode (the anode electrode) 44 is then formed on the p$^+$-type SiC layer 16. The first electrode 44 is formed by sputtering a metal film, for example.

The second electrode (the cathode electrode) 46 is then formed on the second face of the n-type SiC substrate 12. The second electrode 46 is formed by sputtering a metal film, for example.

After that, annealing is performed to lower the contact resistance between the first electrode 44 and the second electrode 46, for example. The annealing is performed in an argon gas atmosphere at 800 to 1000° C., for example.

By the above described manufacturing method, the PiN diode 100 shown in FIG. 1 is formed.

By the manufacturing method of this embodiment, a device is formed on the n-type SiC substrate 12 that has fewer crystal defects by virtue of co-doping with Al and N. Accordingly, propagation of crystal defects into the device region is restrained, and the high-performance PiN diode 100 can be manufactured.

Also, the device is formed on the n-type SiC substrate 12 that has a resistance lowered by the co-doping with Al and N. Accordingly, the high-performance PiN diode 100 with a lower ON resistance can be manufactured.

Also, the device is formed on the n-type SiC substrate 12 that has a resistance lowered by the co-doping with Al and N. Accordingly, even if the substrate has a great film thickness, the resistance thereof is lower than that in a case where co-doping is not performed. Normally, to lower ON resistance, the wafer thickness is reduced. In that case, however, wafer handleability is sacrificed, as the wafer thickness becomes smaller. According to this embodiment, the PiN diode 100 can be manufactured, without sacrifice of wafer handleability.

Second Embodiment

A semiconductor device of this embodiment is a schottky barrier diode (SBD). The function and the like of co-doping with a p-type impurity and an n-type impurity are the same as those of the first embodiment, and therefore, explanation of them is not repeated herein.

Figure 9:
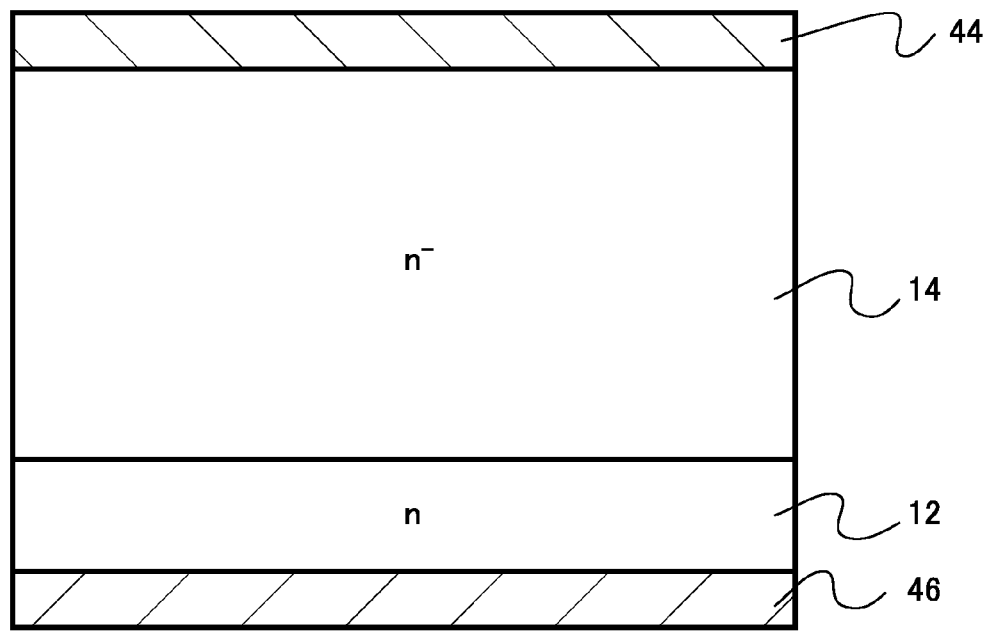
FIG. 9 is a schematic cross-sectional view of a semiconductor device of a second embodiment.

FIG. 9 is a schematic cross-sectional view of the semiconductor device of this embodiment.

The schottky barrier diode 200 includes an n-type SiC substrate (a silicon carbide substrate) 12 having first and second faces.

This n-type SiC substrate 12 is a 4H—SiC substrate, for example. The n-type SiC substrate 12 contains Al (aluminum) as the p-type impurity and N (nitrogen) as the n-type impurity.

The ratio of the Al concentration to the N concentration (Al concentration/N concentration) in the n-type SiC substrate 12 is higher than 0.40 but lower than 0.95. The N concentration is not lower than $1 \times 10^{18}$ cm$^{-3}$ and not higher than $1 \times 10^{22}$ cm$^{-3}$. The N concentration may be a constant value within the above range, or may exhibit a concentration gradient within the above range. The film thickness of the n-type SiC substrate 12 may be 300 to 700 μm, for example.

An n-type SiC layer (an n$^-$-SiC layer) 14 is formed on the first face of the SiC substrate 12. The concentration of the n-type impurity in the n⁻-SiC layer 14 is approximately $5 \times 10^{15}$ to $2 \times 10^{16}$ cm$^{-3}$, for example. The n-type impurity is N, for example. The film thickness of the n⁻-SiC layer 14 is approximately 5 to 50 μm, for example.

A conductive first electrode (an anode electrode) 44 that is electrically connected to the n⁻-SiC layer 14 is provided on the n⁻-SiC layer 14. The first electrode 44 is made of a metal such as Ti (titanium), Ni (nickel), or Al (aluminum), or a metal compound, for example. The first electrode 44 is in schottky contact with the n⁻-SiC layer 14.

Meanwhile, a conductive second electrode (a cathode electrode) 46 is formed on the second face of the n-type SiC substrate 12. The second electrode 46 is made of a metal such as Ti (titanium), Ni (nickel), or Al (aluminum), or a metal compound, for example. The second electrode 46 is in ohmic contact with the n-type SiC substrate 12.

Referring to FIG. 9, an example of a method of manufacturing the semiconductor device of this embodiment is now described.

First, the n-type SiC substrate 12 that has first and second faces, and contains Al (aluminum) and N (nitrogen) is prepared. The ratio of the Al concentration to the N concentration is higher than 0.40 but lower than 0.95, and the N concentration is not lower than $1 \times 10^{18}$ cm$^{-3}$ and not higher than $1 \times 10^{22}$ cm$^{-3}$. The n-type SiC substrate 12 is a substrate manufactured by high-temperature CVD (HTCVD), for example.

The n-type SiC layer (the n⁻-SiC layer) 14 is then formed on the first face of the n-type SiC substrate 12. The n-type SiC layer (the n⁻-SiC layer) 14 is formed through epitaxial growth using CVD, for example.

The first electrode (the anode electrode) 44 is then formed on the n⁻-SiC layer 14. The first electrode 44 is formed by sputtering a metal film, for example.

The second electrode (the cathode electrode) 46 is then formed on the second face of the n-type SiC substrate 12. The second electrode 46 is formed by sputtering a metal film, for example.

After that, annealing is performed. The annealing is performed in an argon gas atmosphere at 800 to 1000° C., for example.

By the above described manufacturing method, the schottky barrier diode 200 shown in FIG. 9 is formed.

In this embodiment, the n-type SiC substrate 12 is co-doped with Al as the p-type impurity and N as the n-type impurity at a desired ratio, as in the first embodiment. Accordingly, the high-performance schottky barrier diode 200 can be realized by virtue of the same function and effects as those of the first embodiment.

It should be noted that the preferred ranges of impurity densities in the n-type SiC substrate 12, the preferred range of concentration ratios, the preferred range of donor levels, the preferred lattice site locations of Al, and the like are the same as those of the first embodiment.

Third Embodiment

A semiconductor device of this embodiment is a merged PiN schottky diode (MPS). The function and the like of co-doping with a p-type impurity and an n-type impurity are the same as those of the first embodiment, and therefore, explanation of them is not repeated herein.

Figure 10:
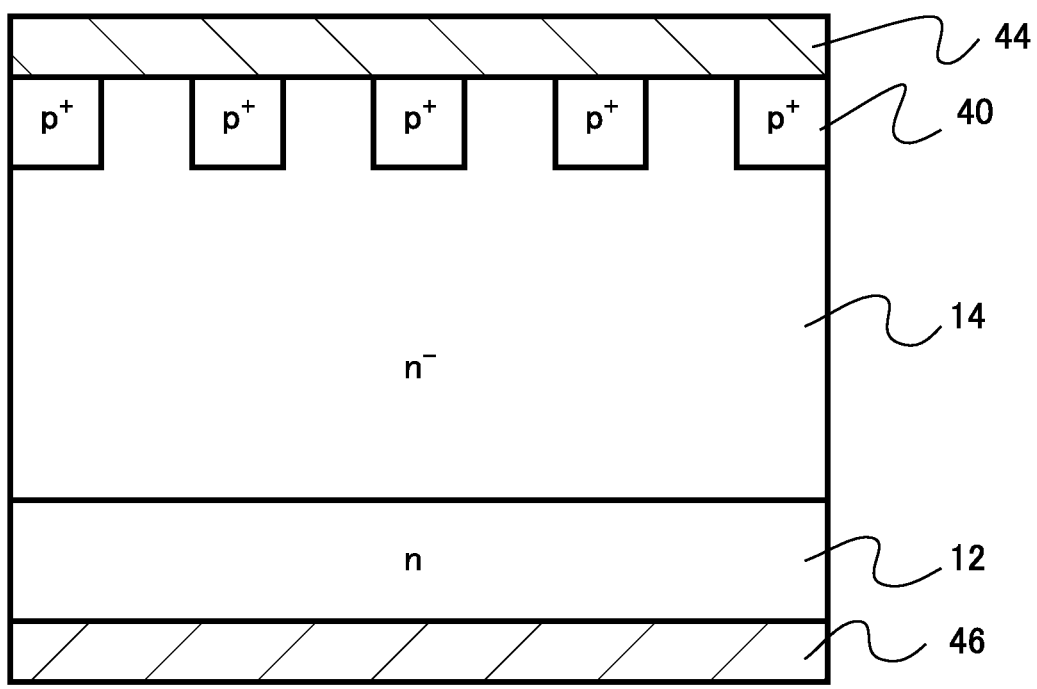
FIG. 10 is a schematic cross-sectional view of a semiconductor device of a third embodiment.

FIG. 10 is a schematic cross-sectional view of the semiconductor device of this embodiment.

The MPS 300 includes an n-type SiC substrate (a silicon carbide substrate) 12 having first and second faces.

This n-type SiC substrate 12 is a 4H—SiC substrate, for example. The n-type SiC substrate 12 contains Al (aluminum) as the p-type impurity and N (nitrogen) as the n-type impurity.

The ratio of the Al concentration to the N concentration (Al concentration/N concentration) in the n-type SiC substrate 12 is higher than 0.40 but lower than 0.95. The N concentration is not lower than $1 \times 10^{18}$ cm$^{-3}$ and not higher than $1 \times 10^{22}$ cm$^{-3}$. The N concentration may be a constant value within the above range, or may exhibit a concentration gradient within the above range. The film thickness of the n-type SiC substrate 12 may be 300 to 700 μm, for example.

An n-type SiC layer (an n⁻-SiC layer) 14 is formed on the first face of the SiC substrate 12. The concentration of the n-type impurity in the n⁻-SiC layer 14 is approximately $5 \times 10^{15}$ to $2 \times 10^{16}$ cm$^{-3}$, for example. The n-type impurity is N, for example. The film thickness of the n⁻-SiC layer 14 is approximately 5 to 50 μm, for example.

P-type SiC regions (p⁺-type SiC regions) 40 are formed on the surface of the n⁻-SiC layer 14. The p⁺-type SiC regions 40 have the function to reduce leakage current by forming depletion layers in the n⁻-SiC layer 14 when the MPS 300 is off. The impurity densities in the p⁺-type SiC regions 40 are approximately $5 \times 10^{18}$ to $5 \times 10^{21}$ cm$^{-3}$, for example. The p-type impurity is Al, for example. The depth of the p⁺-type SiC regions 40 is approximately 0.5 to 1 μm, for example.

A conductive first electrode (an anode electrode) 44 that is electrically connected to the n⁻-SiC layer 14 and the p⁺-type SiC regions 40 is provided on the n⁻-SiC layer 14 and the p⁺-type SiC regions 40. The first electrode 44 is made of a metal such as Ti (titanium), Ni (nickel), or Al (aluminum), or a metal compound, for example. The first electrode 44 is in schottky contact with the n⁻-SiC layer 14. The first electrode 44 is also in ohmic contact with the p⁺-type SiC regions 40.

Meanwhile, a conductive second electrode (a cathode electrode) 46 is formed on the second face of the n-type SiC substrate 12. The second electrode 46 is made of a metal such as Ti (titanium), Ni (nickel), or Al (aluminum), or a metal compound, for example. The second electrode 46 is in ohmic contact with the n-type SiC substrate 12.

Referring to FIG. 10, an example of a method of manufacturing the semiconductor device of this embodiment is now described.

First, the n-type SiC substrate 12 that has first and second faces, and contains Al (aluminum) and N (nitrogen) is prepared. The ratio of the Al concentration to the N concentration is higher than 0.40 but lower than 0.95, and the N concentration is not lower than $1 \times 10^{18}$ cm$^{-3}$ and not higher than $1 \times 10^{22}$ cm$^{-3}$. The n-type SiC substrate 12 is a substrate manufactured by high-temperature CVD (HTCVD), for example.

The n-type SiC layer (the n⁻-SiC layer) 14 is then formed on the first face of the n-type SiC substrate 12. The n-type SiC layer (the n⁻-SiC layer) 14 is formed through epitaxial growth using CVD, for example.

The p⁺-type SiC regions 40 are then formed on the surface of the n⁻-SiC layer 14. The p⁺-type SiC regions 40 are formed through Al ion implantation, for example.

The first electrode (the anode electrode) 44 is then formed on the n⁻-SiC layer 14 and the p⁺-type SiC regions 40. The first electrode 44 is formed by sputtering a metal film, for example.

The second electrode (the cathode electrode) 46 is then formed on the second face of the n-type SiC substrate 12. The second electrode 46 is formed by sputtering a metal film, for example.

After that, annealing is performed. The annealing is performed in an argon gas atmosphere at 800 to 1000° C., for example.

By the above described manufacturing method, the MPS 300 shown in FIG. 10 is formed.

In this embodiment, the n-type SiC substrate 12 is co-doped with Al as the p-type impurity and N as the n-type impurity at a desired ratio, as in the first embodiment. Accordingly, the high-performance MPS 300 can be realized by virtue of the same function and effects as those of the first embodiment.

It should be noted that the preferred ranges of impurity densities in the n-type SiC substrate 12, the preferred range of concentration ratios, the preferred range of donor levels, the preferred lattice site locations of Al, and the like are the same as those of the first embodiment.

Fourth Embodiment

A semiconductor device of this embodiment is a vertical MOSFET (Metal Oxide Semiconductor Field Effect Transistor). The function and the like of co-doping with a p-type impurity and an n-type impurity are the same as those of the first embodiment, and therefore, explanation of them is not repeated herein.

Figure 11:
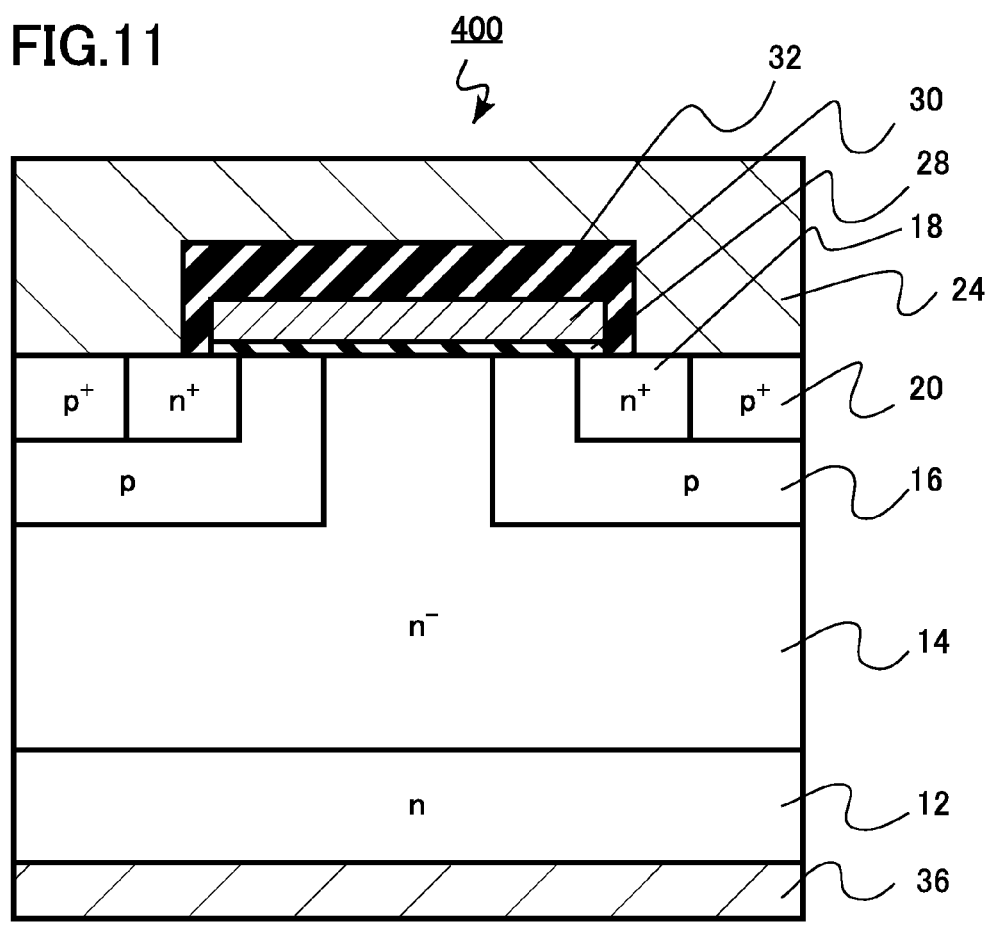
FIG. 11 is a schematic cross-sectional view of a semiconductor device of a fourth embodiment.

FIG. 11 is a schematic cross-sectional view of the semiconductor device of this embodiment. This MOSFET 400 is a Double Implantation MOSFET (DIMOSFET) having a p-well and a source region formed through ion implantation, for example.

The MOSFET 400 includes an n-type SiC substrate (a silicon carbide substrate) 12 having first and second faces. In FIG. 11, the first face is the upper face, and the second face is the lower face.

This n-type SiC substrate 12 is a 4H—SiC substrate, for example. The n-type SiC substrate 12 contains Al (aluminum) as the p-type impurity and N (nitrogen) as the n-type impurity.

The ratio of the Al concentration to the N concentration (Al concentration/N concentration) in the n-type SiC substrate 12 is higher than 0.40 but lower than 0.95. The N concentration is not lower than $1 \times 10^{18}$ cm$^{-3}$ and not higher than $1 \times 10^{22}$ cm$^{-3}$. The N concentration may be a constant value within the above range, or may exhibit a concentration gradient within the above range. The film thickness of the n-type SiC substrate 12 may be 300 to 700 μm, for example.

An n-type SiC layer (an n$^-$-SiC layer) 14 is formed on the first face of the SiC substrate 12. The concentration of the n-type impurity in the n$^-$-SiC layer 14 is approximately $5 \times 10^{15}$ to $2 \times 10^{16}$ cm$^{-3}$, for example. The n-type impurity is N, for example. The film thickness of the n$^-$-SiC layer 14 is approximately 5 to 50 μm, for example.

A p-type SiC region (a p-well region) 16 is formed in part of the surface of the n$^-$-SiC layer 14. The concentration of the p-type impurity in the p-well region 16 is approximately $5 \times 10^{15}$ to $1 \times 10^{17}$ cm$^{-3}$, for example. The p-type impurity is Al, for example. The depth of the p-well region 16 is approximately 0.6 for example. The p-well region 16 functions as the channel region of the MOSFET 400.

An n$^+$-type SiC regions (a source region) 18 is formed in part of the surface of the p-well region 16. The n-type impurity concentration in the source region 18 is approximately $5 \times 10^{19}$ to $1 \times 10^{21}$ cm$^{-3}$, for example. The n-type impurity is N, for example. The depth of the source region 18 is smaller than the depth of the p-well region 16, and is approximately 0.3 μm, for example.

A p$^+$-type SiC region (a p-well contact region) 20 is also formed in part of the surface of the p-well region 16 and on the side of the source region 18. The concentration of the p-type impurity in the p-well contact region 20 is approximately $5 \times 10^{19}$ to $1 \times 10^{21}$ cm$^{-3}$, for example. The p-type impurity is Al, for example. The depth of the p-well contact region 20 is smaller than the depth of the p-well region 16, and is approximately 0.3 μm, for example.

A gate insulating film 28 is continuously formed on the surfaces of the n$^-$-SiC layer 14 and the p-well region 16, so as to bridge the region and the layer. The gate insulating film 28 may be an SiO$_2$ film or a high-k insulating film, for example.

A gate electrode 30 is formed on the gate insulating film 28. The gate electrode 30 may be made of polysilicon, for example. An interlayer insulating film 32 formed with an SiO$_2$ film, for example, is formed on the gate electrode 30.

The p-well region 16 interposed between the source region 18 under the gate electrode 30 and the n$^-$-SiC layer 14 functions as the channel region of the MOSFET 400.

A conductive first electrode (a source/p-well common electrode) 24 that is electrically connected to the source region 18 and the p-well contact region 20 is then formed. The first electrode (the source/p-well common electrode) 24 is made of a metal such as Ti (titanium), Ni (nickel), or Al (aluminum), or a metal compound, for example. The first electrode 24 is in ohmic contact with the source region 18 and the p-well contact region 20.

A conductive second electrode (a drain electrode) 36 is formed on the second face of the n-type SiC substrate 12. The second electrode (the drain electrode) 36 is made of a metal such as Ti (titanium), Ni (nickel), or Al (aluminum), or a metal compound, for example. The second electrode 36 is in ohmic contact with the n-type SiC substrate 12.

Referring to FIG. 11, an example of a method of manufacturing the semiconductor device of this embodiment is now described.

First, the n-type SiC substrate 12 that has first and second faces, and contains Al (aluminum) and N (nitrogen) is prepared. The ratio of the Al concentration to the N concentration is higher than 0.40 but lower than 0.95, and the N concentration is not lower than $1 \times 10^{18}$ cm$^{-3}$ and not higher than $1 \times 10^{22}$ cm$^{-3}$. The n-type SiC substrate 12 is a substrate manufactured by high-temperature CVD (HTCVD), for example.

The n-type SiC layer (the n$^-$-SiC layer) 14 is then formed on the first face of the n-type SiC substrate 12. The n-type SiC layer (the n$^-$-SiC layer) 14 is formed through epitaxial growth by CVD, for example.

The p-type SiC region (the p-well region) 16 is then formed on the surface of the n$^-$-SiC layer 14. The p-well region 16 is formed through Al ion implantation, for example.

The source region 18 is then formed in part of the surface of the p-well region 16. The n$^+$-type source region 18 is formed through N ion implantation, for example.

The p$^+$-type p-well contact region 20 is then formed in part of the surface of the p-well region 16 and on the side of the source region 18. The p-well contact region 20 is formed through Al ion implantation, for example.

The gate insulating film 28 is then continuously formed on the surfaces of the n$^-$-SiC layer 14 and the p-well region 16. The gate insulating film 28 is formed by CVD, for example.

The gate electrode 30 and the interlayer insulating film 32 are then formed on the gate insulating film 28 by using a known process.

The first electrode (the source/p-well common electrode) 24 is formed on the source region 18 and the p-well contact region 20. The first electrode 24 is formed by sputtering a metal film, for example.

The second electrode (the drain electrode) 36 is then formed on the second face of the n-type SiC substrate 12. The second electrode 36 is formed by sputtering a metal film, for example.

After that, annealing is performed. The annealing is performed in an argon gas atmosphere at 800 to 1000° C., for example.

By the above described manufacturing method, the MOSFET 400 shown in FIG. 11 is formed.

In this embodiment, the n-type SiC substrate 12 is co-doped with Al as the p-type impurity and N as the n-type impurity at a desired ratio, as in the first embodiment. Accordingly, the high-performance MOSFET 400 can be realized by virtue of the same function and effects as those of the first embodiment.

It should be noted that the preferred ranges of impurity densities in the n-type SiC substrate 12, the preferred range of concentration ratios, the preferred range of donor levels, the preferred lattice site locations of Al, and the like are the same as those of the first embodiment.

Fifth Embodiment

A semiconductor device of this embodiment includes: a p-type SiC substrate that has first and second faces, and contains a p-type impurity and an n-type impurity, the p-type impurity being an element A, the n-type impurity being an element D, the element A and the element D being a combination of Al (aluminum), Ga (gallium), or In (indium) and N (nitrogen), and/or a combination of B (boron) and P (phosphorus), the ratio of the concentration of the element D to the concentration of the element A in the combination (s) being higher than 0.33 but lower than 0.995, the concentration of the element A forming part of the combination (s) being not lower than $1 \times 10^{18}$ cm$^{-3}$ and not higher than $1 \times 10^{22}$ cm$^{-3}$; an SiC layer formed on the first face; a first electrode formed on the first face side; and a second electrode formed on the second face.

In the case of the first combination of Al (aluminum), Ga (gallium), or In (indium) and N (nitrogen), for example, the element A may be a single element selected from Al (aluminum), Ga (gallium), and In (indium). Alternatively, the element A may be formed with two elements such as Al (an element $A_1$) and Ga (an element $A_2$) or may be formed with three elements such as Al (the element $A_1$), Ga (the element $A_2$), and In (an element $A_3$). In a case where the element A is formed with more than one element, the element A may be formed with two or three kinds of elements, as long as the above described conditions on the ratio of the concentration of the element D to the concentration of the element A and on the concentration of the element A are satisfied.

The first combination and the second combination can coexist. However, the above described conditions on the ratio of the concentration of the element D to the concentration of the element A and on the concentration of the element A should be satisfied with elements that form at least one of the first and second combinations. In other words, each of the first combination and the second combination should satisfy the conditions on the element ratio and the element concentration. This is because the later described trimers are not formed between an impurity in the first combination and an impurity in the second combination.

In a case where the Al concentration is $1 \times 10^{18}$ cm$^{-3}$, the Ga concentration is $1 \times 10^{18}$ cm$^{-3}$, and the N concentration is $1 \times 10^{18}$ cm$^{-3}$, for example, N/(Al+Ga) is 0.5, and (Al+Ga) is $2 \times 10^{18}$ cm$^{-3}$. In this case, the element ratio and the element densities are within the ranges set by this embodiment.

In a case where the B concentration is $4 \times 10^{18}$ cm$^{-3}$, the P concentration is $1 \times 10^{18}$ cm$^{-3}$, and the N concentration is $1 \times 10^{18}$ cm$^{-3}$, for example, attention is paid only to B and P, which is the second combination. As a result, P/B is 0.25, which does not satisfy the element ratio condition, and is outside the range set by this embodiment.

Also, in a case where the Al concentration is $5 \times 10^{17}$ cm$^{-3}$, the B concentration is $5 \times 10^{17}$ cm$^{-3}$, the N concentration is $2.5 \times 10^{17}$ cm$^{-3}$, and the P concentration is $2.5 \times 10^{17}$ cm$^{-3}$, N/Al is 0.5, which satisfies the ratio condition, but the Al concentration is lower than $1 \times 10^{18}$ cm$^{-3}$ in the first combination. In the second combination, P/B is 0.5, which satisfies the ratio condition, but the B concentration is lower than $1 \times 10^{18}$ cm$^{-3}$. Therefore, either of the first and second combinations does not satisfy the element ratio condition and the element concentration condition, and is outside the range set by the embodiment.

It should be noted that this embodiment does not exclude elements other than the above mentioned elements as p-type impurities and n-type impurities. In the following, an example case where the element A is Al (aluminum) and the element D is N (nitrogen) is described.

A semiconductor device of this embodiment is a vertical IGBT (Insulated Gate Bipolar Transistor). The function and the like of co-doping with a p-type impurity and an n-type impurity are the same as those of the first embodiment, and therefore, explanation of them is not repeated herein.

Figure 12:
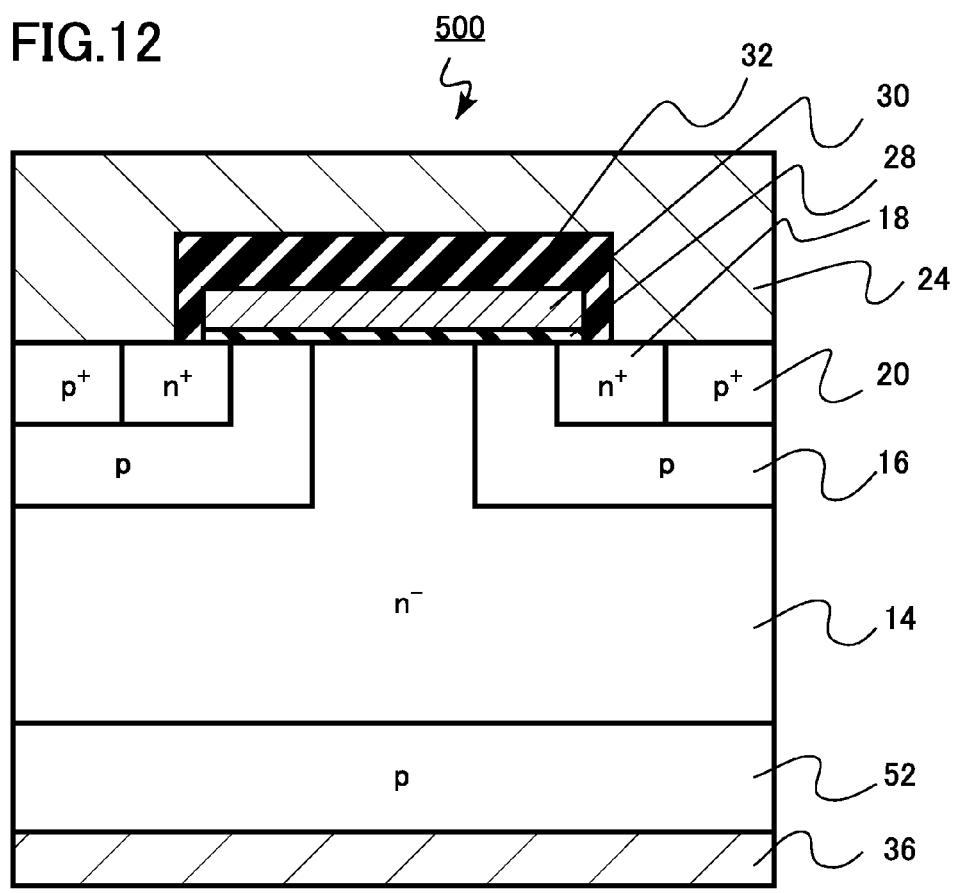
FIG. 12 is a schematic cross-sectional view of a semiconductor device of a fifth embodiment.

FIG. 12 is a schematic cross-sectional view of the semiconductor device of this embodiment.

This IGBT 500 includes a p-type SiC substrate (a silicon carbide substrate) 52 having first and second faces. In FIG. 12, the first face is the upper face, and the second face is the lower face.

This p-type SiC substrate 52 is a 4H—SiC substrate, for example. The p-type SiC substrate 52 contains Al (aluminum) as the p-type impurity and N (nitrogen) as the n-type impurity.

The ratio of the N concentration to the Al concentration (N concentration/Al concentration) in the p-type SiC substrate 52 is higher than 0.33 but lower than 0.995. The Al concentration is not lower than $1 \times 10^{18}$ cm$^{-3}$ and not higher than $1 \times 10^{22}$ cm$^{-3}$. The Al concentration may be a constant value within the above range, or may exhibit a concentration gradient within the above range. The film thickness of the p-type SiC substrate 52 may be 300 to 700 μm, for example.

An n-type SiC layer (an n$^-$-SiC layer) 14 is formed on the first face of the p-type SiC substrate 52. The concentration of the n-type impurity in the n$^-$-SiC layer 14 is lower than the p-type impurity concentration in the p-type SiC substrate 52, and is approximately $5 \times 10^{15}$ to $2 \times 10^{16}$ cm$^{-3}$, for example. The n-type impurity is N, for example. The film thickness of the n$^-$-SiC layer 14 is approximately 5 to 50 μm, for example.

A p-type SiC region (a first emitter region) 16 is formed in part of the surface of the n$^-$-SiC layer 14. The concentration of the p-type impurity in the first emitter region 16 is approximately $5 \times 10^{15}$ to $1 \times 10^{17}$ cm$^{-3}$, for example. The p-type impurity is Al, for example. The depth of the first emitter region 16 is approximately 0.6 μm, for example. The first emitter region 16 functions as the channel region of the IGBT 500.

An n$^+$-type SiC region (a second emitter region) 18 is formed in part of the surface of the first emitter region 16. The n-type impurity concentration in the second emitter region 18 is approximately $5 \times 10^{19}$ to $1 \times 10^{21}$ cm$^{-3}$, for example. The n-type impurity is N, for example. The depth of the second emitter region 18 is smaller than the depth of the first emitter region 16, and is approximately 0.3 μm, for example.

A p$^+$-type SiC region (an emitter contact region) 20 is also formed in part of the surface of the first emitter region 16 and on the side of the second emitter region 18. The concentration of the p-type impurity in the emitter contact region 20 is approximately $5 \times 10^{19}$ to $1 \times 10^{21}$ cm$^{-3}$, for example. The p-type impurity is Al, for example. The depth of the emitter contact region 20 is smaller than the depth of the first emitter region 16, and is approximately 0.3 μm, for example.

A gate insulating film 28 is continuously formed on the surfaces of the n⁻-SiC layer 14 and the first emitter region 16, so as to bridge the region and the layer. The gate insulating film 28 may be an SiO₂ film or a high-k insulating film, for example.

A gate electrode 30 is formed on the gate insulating film 28. The gate electrode 30 may be made of polysilicon, for example. An interlayer insulating film 32 formed with an SiO₂ film, for example, is formed on the gate electrode 30.

The first emitter region 16 interposed between the second emitter region 18 under the gate electrode 30 and the n⁻-SiC layer 14 functions as the channel region of the IGBT 500.

A conductive first electrode (an emitter electrode) 24 that is electrically connected to the second emitter region 18 and the emitter contact region 20 is provided. The first electrode (the emitter electrode) 24 is made of a metal such as Ti (titanium), Ni (nickel), or Al (aluminum), or a metal compound, for example. The first electrode 24 is in ohmic contact with the second emitter region 18 and the emitter contact region 20.

A conductive second electrode (a collector electrode) 36 is formed on the second face of the p-type SiC substrate 52. The second electrode (the collector electrode) 36 is made of a metal such as Ti (titanium), Ni (nickel), or Al (aluminum), or a metal compound, for example. The second electrode 36 is in ohmic contact with the p-type SiC substrate 52.

In the IGBT 500 of this embodiment, the p-type SiC substrate 52 is co-doped with Al as the p-type impurity and N as the n-type impurity at a desired ratio. Accordingly, the resistivity of the p-type SiC substrate 52 is lower than that in a case where co-doping is not performed. Also, the contact resistance between the second electrode 36 and the p-type SiC substrate 52 is lower than that in a case where co-doping is not performed. Accordingly, the IGBT 500 with a low ON resistance and a large ON current is realized.

Furthermore, trimers are formed by co-doping, and strain in the p-type SiC substrate 52 is relaxed even when the impurity densities are high. For example, even when the impurity densities are $1 \times 10^{19}$ cm⁻³ or higher, or $1 \times 10^{20}$ cm⁻³ or higher, formation of crystal defects in the p-type SiC substrate 52 is restrained. As fewer crystal defects exist in the p-type SiC substrate 52, characteristics degradation due to crystal defects does not easily occur.

Accordingly, the IGBT 500 having a smaller leakage current in an OFF state is realized, for example. Alternatively, the high-voltage IGBT 500 that excels in energization breakdown tolerance is realized.

The concentration of Al as the p-type impurity contained in the p-type SiC substrate 52 is not lower than $1 \times 10^{18}$ cm⁻³ and not higher than $1 \times 10^{22}$ cm⁻³. This is because, if the Al concentration is below the range, the resistivity of the p-type SiC substrate 52 and the contact resistance between the second electrode 36 and the p-type SiC substrate 52 become higher, and the ON resistance might become too high. This is also because it is difficult to solve a p-type impurity having a concentration above the range.

So as to sufficiently lower the resistivity of the p-type SiC substrate 52 and the contact resistance between the second electrode 36 and the p-type SiC substrate 52, the concentration of the p-type impurity contained in the p-type SiC substrate 52 is preferably $1 \times 10^{19}$ cm⁻³ or higher, or more preferably, $1 \times 10^{20}$ cm⁻³ or higher.

So as to sufficiently lower the resistivity of the p-type SiC substrate 52 and the contact resistance between the second electrode 36 and the p-type SiC substrate 52, the ratio of the N concentration to the Al concentration (N concentration/Al concentration) in the p-type SiC substrate 52 is higher than 0.33 but lower than 0.995. Also, the ratio of the N concentration to the Al concentration is preferably higher than 0.40 but lower than 0.95. More preferably, the ratio is not lower than 0.45 and not higher than 0.75. Even more preferably, the ratio is not lower than 0.47 and not higher than 0.60.

The ratio of the N concentration to the Al concentration can be calculated by determining the respective densities of N and Al by SIMS (Secondary Ion Microprobe Spectrometry), for example.

So as to sufficiently lower the resistivity of the p-type SiC substrate 52 and the contact resistance between the second electrode 36 and the p-type SiC substrate 52, the donor levels that contribute to generation of Al carriers are preferably 150 meV or shallower. More preferably, the donor levels are 100 meV or shallower. Even more preferably, the donor levels are 40 meV or shallower.

The acceptor levels of Al can be determined by measuring the activation energy of the sheet resistance or the resistivity of the p-type SiC substrate 52, or the contact resistance between the second electrode 36 and the p-type SiC substrate 52, for example.

So as to sufficiently lower the resistivity of the p-type SiC substrate 52 and the contact resistance between the second electrode 36 and the p-type SiC substrate 52, and realize a low ON resistance, most of the p-type impurity and the n-type impurity preferably form trimers. Therefore, 90% or more of N is preferably in the lattice site locations nearest to Al. If 90% or more of N is in the lattice site locations nearest to Al, most (90% or more) of N and Al can be considered to form trimers.

Of all N, the proportion of the element in the lattice site locations nearest to Al can be determined by analyzing the binding state between N and Al by XPS (X-ray Photoelectron Spectroscopy), for example.

Referring to FIG. 12, an example of a method of manufacturing the semiconductor device of this embodiment is now described.

A method of manufacturing the semiconductor device of this embodiment includes preparing a p-type SiC substrate that has first and second faces, and contains a p-type impurity and an n-type impurity, the p-type impurity being an element A, the n-type impurity being an element D, the element A and the element D being a combination of Al (aluminum), Ga (gallium), or In (indium) and N (nitrogen), and/or a combination of B (boron) and P (phosphorus), the ratio of the concentration of the element D to the concentration of the element A in the combination(s) being higher than 0.33 but lower than 0.995, the concentration of the element A forming part of the combination(s) being not lower than $1 \times 10^{18}$ cm⁻³ and not higher than $1 \times 10^{22}$ cm⁻³. An SiC layer is then formed on the first face, a first electrode is formed on the first face side, and a second electrode is formed on the second face.

In the following, an example case where the element A is Al and the element D is N is described.

First, the p-type SiC substrate 52 that has first and second faces, and contains N (nitrogen) and Al (aluminum) is prepared. The ratio of the N concentration to the Al concentration is higher than 0.33 but lower than 0.995, and the Al concentration is not lower than $1 \times 10^{18}$ cm⁻³ and not higher than $1 \times 10^{22}$ cm⁻³. The p-type SiC substrate 52 is a substrate manufactured by epitaxial growth using high-temperature CVD (HTCVD), for example.

The n-type SiC layer (the n⁻-SiC layer) 14 is then formed on the first face of the p-type SiC substrate 52. The n-type SiC layer (the n⁻-SiC layer) 14 is formed through epitaxial growth by CVD, for example.

The p-type SiC region (the first emitter region) 16 is then formed on the surface of the n⁻-SiC layer 14. The first emitter region 16 is formed through Al ion implantation, for example.

The second emitter region 18 is then formed in part of the surface of the first emitter region 16. The n⁺-type second emitter region 18 is formed through N ion implantation, for example.

The p⁺-type emitter contact region 20 is then formed in part of the surface of the first emitter region 16 and on the side of the second emitter region 18. The emitter contact region 20 is formed through Al ion implantation, for example.

The gate insulating film 28 is then continuously formed on the surfaces of the n⁻-SiC layer 14 and the first emitter region 16. The gate insulating film 28 is formed by CVD, for example.

The gate electrode 30 and the interlayer insulating film 32 are then formed on the gate insulating film 28 by using a known process.

The first electrode (the emitter electrode) 24 is then formed on the second emitter region 18 and the emitter contact region 20. The first electrode 24 is formed by sputtering a metal film, for example.

The second electrode (the collector electrode) 36 is then formed on the second face of the p-type SiC substrate 52. The second electrode 36 is formed by sputtering a metal film, for example.

After that, annealing is performed. The annealing is performed in an argon gas atmosphere at 800 to 1000° C., for example.

By the above described manufacturing method, the IGBT 500 shown in FIG. 12 is formed.

By the manufacturing method of this embodiment, a device is formed on the p-type SiC substrate 52 that has fewer crystal defects by virtue of co-doping with Al and N. Accordingly, propagation of crystal defects into the device region is restrained, and the high-performance IGBT 500 can be manufactured.

Also, the device is formed on the p-type SiC substrate 52 that has a resistance lowered by the co-doping with Al and N. Accordingly, the high-performance IGBT 500 with a lower ON resistance can be manufactured.

Also, the device is formed on the p-type SiC substrate 52 that has a resistance lowered by the co-doping with Al and N. Accordingly, even if the substrate has a great film thickness, the resistance thereof is lower than that in a case where co-doping is not performed. Normally, to lower ON resistance, the wafer thickness is reduced. In that case, however, wafer handleability is sacrificed, as the wafer thickness becomes smaller. According to this embodiment, the IGBT 500 can be manufactured, without sacrifice of wafer handleability.

Sixth Embodiment

A semiconductor device of this embodiment is a vertical JFET (Junction Field Effect Transistor). The function and the like of co-doping with a p-type impurity and an n-type impurity are the same as those of the first embodiment, and therefore, explanation of them is not repeated herein.

Figure 13:
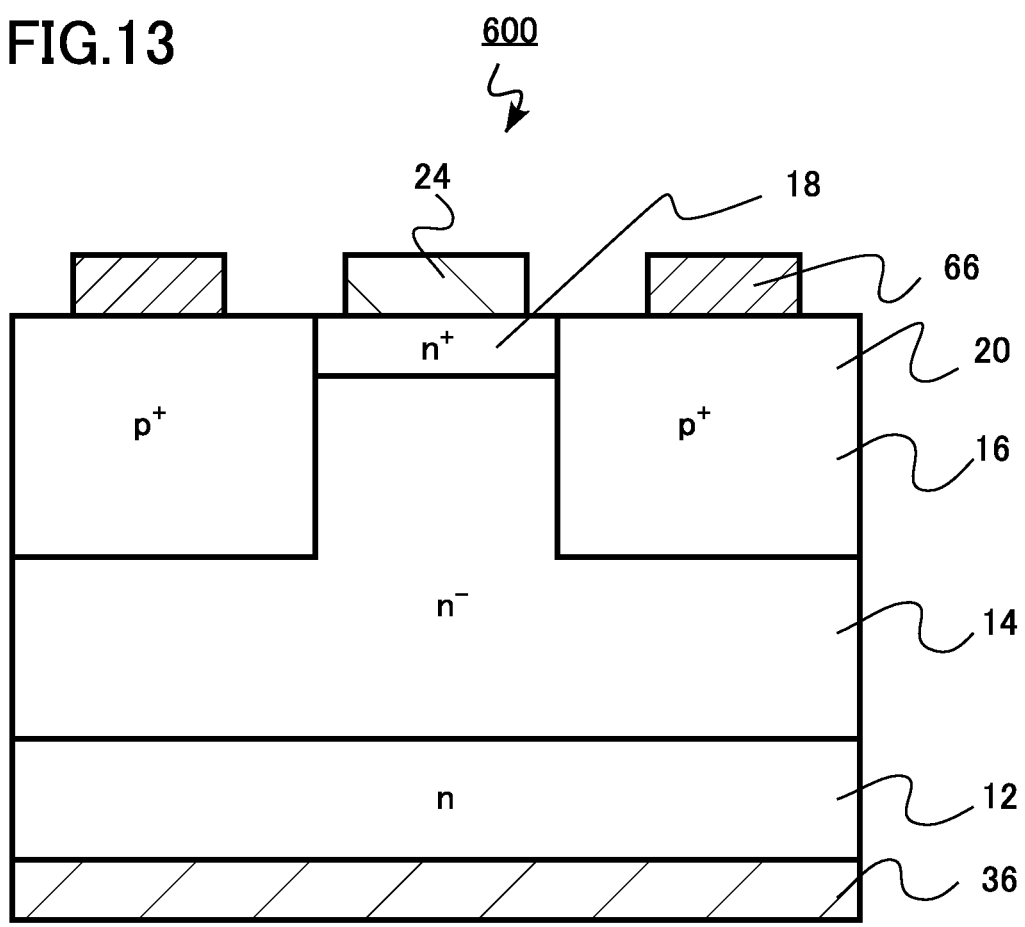
FIG. 13 is a schematic cross-sectional view of a semiconductor device of a sixth embodiment.

FIG. 13 is a schematic cross-sectional view of the semiconductor device of this embodiment.

The JFET 600 includes an n-type SiC substrate (a silicon carbide substrate) 12 having first and second faces. In FIG. 13, the first face is the upper face, and the second face is the lower face.

This n-type SiC substrate 12 is a 4H—SiC substrate, for example. The n-type SiC substrate 12 contains Al (aluminum) as the p-type impurity and N (nitrogen) as the n-type impurity.

The ratio of the Al concentration to the N concentration (Al concentration/N concentration) in the n-type SiC substrate 12 is higher than 0.40 but lower than 0.95. The N concentration is not lower than $1 \times 10^{18}$ cm⁻³ and not higher than $1 \times 10^{22}$ cm⁻³. The N concentration may be a constant value within the above range, or may exhibit a concentration gradient within the above range. The film thickness of the n-type SiC substrate 12 may be 300 to 700 µm, for example.

An n-type SiC layer (an n⁻-SiC layer) 14 is formed on the first face of the SiC substrate 12. The concentration of the n-type impurity in the n⁻-SiC layer 14 is approximately $5 \times 10^{15}$ to $2 \times 10^{16}$ cm⁻³, for example. The n-type impurity is N, for example. The film thickness of the n⁻-SiC layer 14 is approximately 5 to 50 µm, for example.

A p-type SiC region (a gate region) 16 is formed in part of the surface of the n⁻-SiC layer 14. The concentration of the p-type impurity in the gate region 16 is approximately $5 \times 10^{15}$ to $1 \times 10^{17}$ cm⁻³, for example. The p-type impurity is Al, for example. The depth of the gate region 16 is approximately 0.6 µm, for example. The gate region 16 serves as the region to control a depletion layer extending into the n⁻-SiC layer 14 due to variation in applied voltage, and control the current in the JFET 600.

In the surface of the n⁻-SiC layer 14, an n⁺-type SiC region (a source region) 18 is formed between portions of the gate region 16. The n-type impurity concentration in the source region 18 is approximately $5 \times 10^{19}$ to $1 \times 10^{21}$ cm⁻³, for example. The n-type impurity is N, for example. The depth of the source region 18 is smaller than the depth of the gate region 16, and is approximately 0.3 µm, for example.

A conductive first electrode (a source electrode) 24 that is electrically connected to the source region 18 is then formed. The first electrode (the source electrode) 24 is made of a metal such as Ti (titanium), Ni (nickel), or Al (aluminum), or a metal compound, for example. The first electrode 24 is in ohmic contact with the source region 18.

A conductive second electrode (a drain electrode) 36 is formed on the second face of the n-type SiC substrate 12. The second electrode (the drain electrode) 36 is made of a metal such as Ti (titanium), Ni (nickel), or Al (aluminum), or a metal compound, for example. The second electrode 36 is in ohmic contact with the n-type SiC substrate 12.

A conductive third electrode (a gate electrode) 66 that is electrically connected to the gate region 16 is then formed. The third electrode (the gate electrode) 66 is made of a metal such as Ti (titanium), Ni (nickel), or Al (aluminum), or a metal compound, for example. The third electrode (the gate electrode) 66 is in ohmic contact with the gate region 16.

Referring to FIG. 13, an example of a method of manufacturing the semiconductor device of this embodiment is now described.

First, the n-type SiC substrate 12 that has first and second faces, and contains Al (aluminum) and N (nitrogen) is prepared. The ratio of the Al concentration to the N concentration is higher than 0.40 but lower than 0.95, and the N concentration is not lower than $1 \times 10^{18}$ cm⁻³ and not higher than $1 \times 10^{22}$ cm⁻³. The n-type SiC substrate 12 is a substrate manufactured by high-temperature CVD (HTCVD), for example.

The n-type SiC layer (the n⁻-SiC layer) 14 is then formed on the first face of the n-type SiC substrate 12. The n-type SiC layer (the n⁻-SiC layer) 14 is formed through epitaxial growth by CVD, for example.

The p-type SiC region (the gate region) 16 is then formed on the surface of the n⁻-SiC layer 14. The gate region 16 is formed through Al ion implantation, for example.

The source region 18 is then formed in part of the surface of the n⁻-SiC layer 14. The n⁺-type source region 18 is formed through N ion implantation, for example.

The first electrode (the source electrode) 24 is then formed on the source region 18. The first electrode 24 is formed by sputtering a metal film, for example.

The second electrode (the drain electrode) 36 is then formed on the second face of the n-type SiC substrate 12. The second electrode 36 is formed by sputtering a metal film, for example.

Further, the third electrode (the gate electrode) 66 is formed on the gate region 16. The third electrode 66 is formed by sputtering a metal film, for example.

After that, annealing is performed. The annealing is performed in an argon gas atmosphere at 800 to 1000° C., for example.

By the above described manufacturing method, the JFET 600 shown in FIG. 13 is formed.

In this embodiment, the n-type SiC substrate 12 is co-doped with Al as the p-type impurity and N as the n-type impurity at a desired ratio, as in the first embodiment. Accordingly, the high-performance JFET 600 can be realized by virtue of the same function and effects as those of the first embodiment.

It should be noted that the preferred ranges of impurity densities in the n-type SiC substrate 12, the preferred range of concentration ratios, the preferred range of donor levels, the preferred lattice site locations of Al, and the like are the same as those of the first embodiment.

Although SiC (silicon carbide) crystalline structures are 4H—SiC structures in the above described embodiments, the embodiments can also be applied to other crystalline structures such as 6H—SiC and 3C—SiC structures.

Also, in the above described embodiments, the combination of a p-type impurity and an n-type impurity is a combination of Al (aluminum) and N (nitrogen). However, the combination is not limited to that, and the same effects as above can be achieved, as long as the combination is a combination of Al (aluminum), Ga (gallium), or In (indium) and N (nitrogen), and/or a combination of B (boron) and P (phosphorus).

In the embodiments, the n-type impurity is preferably N (nitrogen) or P (phosphorus), for example, but it is possible to use As (arsenic) or the like. Also, the p-type impurity is preferably Al (aluminum), for example, but it is possible to use B (boron), Ga (gallium), In (indium), or the like.

Semiconductor devices that have SiC substrates, SiC layers, SiC regions and the like of the opposite conductivity types from those of the first through sixth embodiments are also included in the scope of the disclosure.

While certain embodiments have been described, these embodiments have been presented by way of example only, and are not intended to limit the scope of the inventions. Indeed, the semiconductor device and the method of manufacturing the same described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:
a p-type SiC substrate having a first face and a second face, the p-type SiC substrate containing a p-type impurity and an n-type impurity, the p-type impurity being an element A, the n-type impurity being an element D, the element A and the element D being at least one of a combination of Al (aluminum), Ga (gallium), or In (indium) and N (nitrogen), and a combination of B (boron) and P (phosphorus), a ratio of a concentration of the element D to a concentration of the element A forming at least one of the combinations being higher than 0.33 but lower than 0.995, the concentration of the element A forming at least one of the combinations being not lower than $1\times10^{18}$ cm$^{-3}$ and not higher than $1\times10^{22}$ cm$^{-3}$;
an SiC layer formed on the first face;
a first electrode formed on a first face side; and
a second electrode formed on the second face.

2. The device according to claim 1, wherein the ratio of the concentration of the element D to the concentration of the element A is higher than 0.40 but lower than 0.95.

3. The device according to claim 1, wherein the concentration of the element A is $1\times10^{19}$ cm$^{-3}$ or higher.

4. The device according to claim 1, wherein an acceptor level of the element A is 150 meV or less.

5. The device according to claim 1, wherein 90% or more of the element D is in a lattice site location nearest to the element A.

* * * * *